United States Patent [19]

Patel et al.

[11] Patent Number: 5,377,197
[45] Date of Patent: Dec. 27, 1994

[54] METHOD FOR AUTOMATICALLY GENERATING TEST VECTORS FOR DIGITAL INTEGRATED CIRCUITS

[75] Inventors: Janak Patel, Champaign, Ill.; Thomas Niermann, Cupertino, Calif.

[73] Assignee: University of Illinois, Champaign, Ill.

[21] Appl. No.: 840,792

[22] Filed: Feb. 24, 1992

[51] Int. Cl.$^5$ .................. G06F 11/00; H04B 17/00
[52] U.S. Cl. ........................................ 371/23; 371/22.3
[58] Field of Search ................ 371/23, 27, 22.1, 22.3, 371/22.4, 22.5

[56] References Cited

U.S. PATENT DOCUMENTS

| | | | |
|---|---|---|---|
| 4,366,393 | 12/1982 | Kasuya | 371/15 |
| 4,801,870 | 1/1989 | Eichelberger et al. | 371/22.4 |
| 4,891,809 | 1/1990 | Hazawa | 371/23 |
| 5,132,974 | 7/1992 | Rosales | 371/22.3 |
| 5,150,366 | 9/1992 | Bardell, Jr. et al. | 371/22.3 |
| 5,187,712 | 2/1993 | Malleo-Roach et al. | 371/22.1 |

OTHER PUBLICATIONS

Miron Abramovici, et al. "Digital Sytems Testing And Testable Design", Computer Science Press, 1990, pp. 93–103; 131–134; 181–281.
T. Gruning, et al., "Accelerated Test Pattern Generation By Cone-Oriented Circuit Partitioning", IEEE, 1990, pp. 418–421.
Tom Kirkland, et al., "A Topological Search Algorithm For ATPG", 24th ACM/IEEE Design Automation Conference, 1987, Paper 28.2, pp. 502–508.
Wu-Tung Cheng, "Split Circuit Model For Test Generation", 25th ACM/IEEE Design Automation Conference, 1988 IEEE, Paper 8.3, pp. 96–101.
Dr. Ralph Marlett, "An Effective Test Generation System For Sequential Circuits", 23rd Design Automation Conference, 1988 IEEE, Paper 14.3, pp. 250–256.
Abhijit Ghosh, et al., "Test Generation and Verification For Highly Sequential Circuits", IEEE Transactions On Computer-Aided Design, vol. 10, No. 5, May 1991, pp. 652–667.
Hi-Keung Tony MA, et al., "Test Generation For Sequential Circuits", IEEE Transactions On Computer-Aided Design, vol. 7, No. 10, Oct. 1988, pp. 1081–1093.

Primary Examiner—Robert W. Beausoliel, Jr.
Assistant Examiner—T. Tu
Attorney, Agent, or Firm—Albert C. Smith

[57] ABSTRACT

A sequential circuit test generation system and method to generate test patterns for sequential without assuming the use of scan techniques or a reset state utilizes the iterative logic array (ILA) model of the sequential circuit and a targeted-D propagation scheme employing both forward time processing (FTP) and reverse time processing (RTP) techniques for assigning a sequence of primary input (PI) values and for producing a an initial pseudo primary input (PPI) vector representing the initial state of the digital circuit at a particular time frame. Improved state justification techniques generate the remaining sequence of PI vectors necessary to put the circuit into the initial state from either known or don't care first states, by means of a heuristic method for reducing required initial state assignments. The method can also be applied to reduce the required number of PI vector assignments is also presented. In another phase of test vector generation, knowledge about the digital circuit behavior is obtained from a fault simulator to identify circuit nodes at which error signals are activated and partly propagated by already generated sequences of test vectors, and this knowledge is utilized with FTP techniques to generate test vector sequences for these nodes.

13 Claims, 20 Drawing Sheets

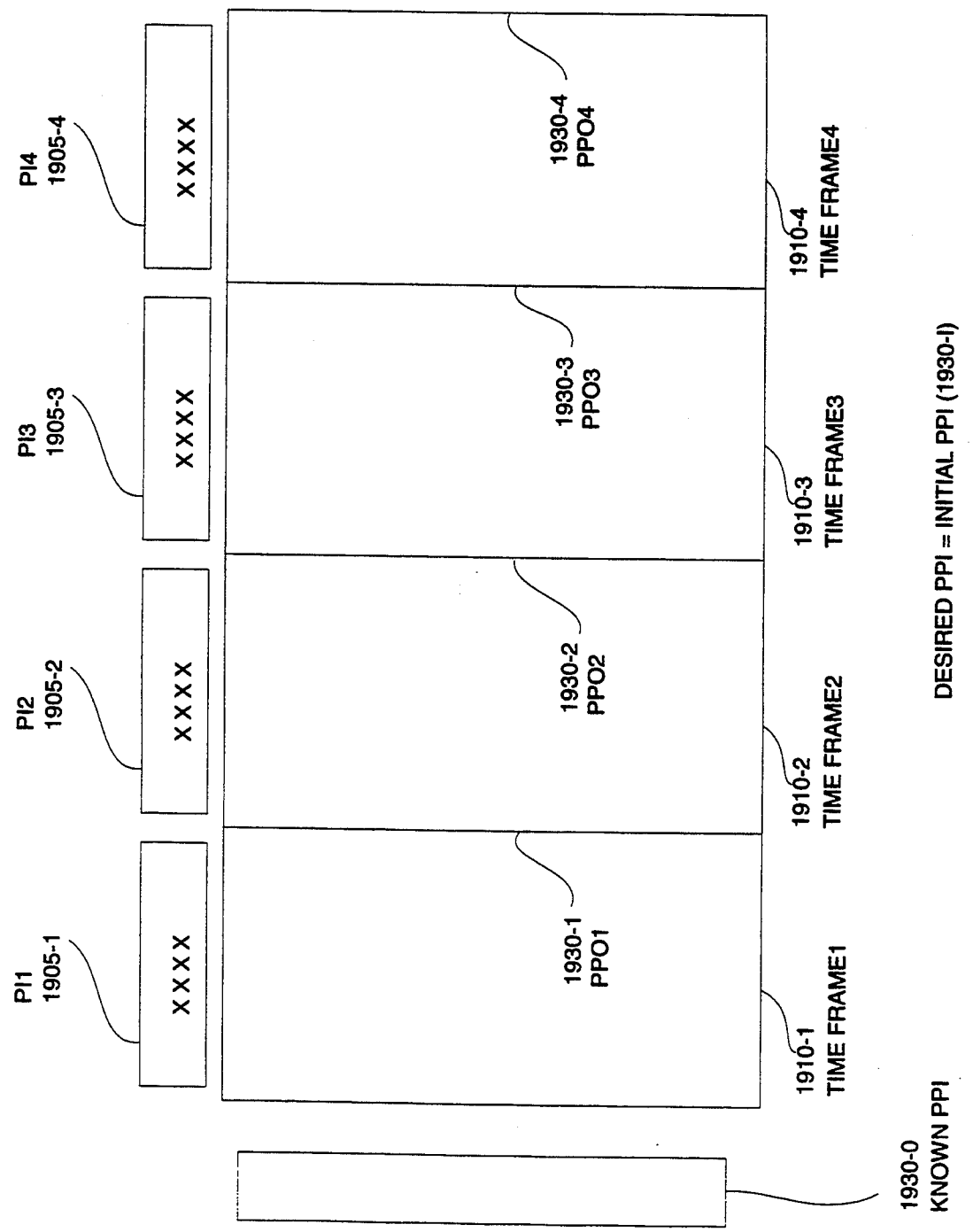

METHOD FOR AUTOMATICALLY GENERATING TEST VECTORS FOR DIGITAL INTEGRATED CIRCUITS

BACKGROUND OF THE INVENTION

1. Field of the Invention

The present invention relates generally to automatic test vector generation and specifically to a method of generating input vectors for testing electronic circuits.

2. Description of the Prior Art

It is common practice to test every circuit after manufacture to see if any manufacturing defects are present. A digital circuit may be tested by applying a sequence of binary vectors and observing the circuit's response. The test vectors are designed to expose the manufacturing defects. Manufacturing defects are typically modeled on the logic gate description of the digital circuit. Chip defects are commonly modeled as a node in the circuit stuck-at logic 0 or stuck-at logic 1. Automatic test vector generation programs analyze the circuit and attempt to excite a stuck-at fault and propagate the faulty effect to an observable primary output (PO).

The field of test generation is covered in the book by Abramovici, Breuer and Friedman (Digital Systems Testing and Testable Design, Computer Science Press, New York, N.Y., 1990, ISBN 0-7167-8179-4).

Most automatic test generators employ systematic search methods to find a binary vector that satisfies the requirements of a test vector. The search methods search over an enormous space of binary vectors and vector sequences. A variety of techniques are provided to speed up the search methods. However, due to the enormity of search space, conventional test generator schemes fail to generate a test sequence that will detect a large number of faults in very large scale integrated (VLSI) circuits. As a consequence, the test sequences generated by such test generators fail to identify many defective chips resulting in poor quality in shipped parts.

SUMMARY OF THE INVENTION

In accordance with the present invention, an automatic test vector generator includes methods for speeding up the search process for a test vector sequence, and also for generating test sequences that detect faults that are abandoned by conventional test generation schemes. The methods according to this invention accomplish an increase in speed and increase in the success rate of a test generator by (a) restricting the search over a well-defined small solution space and assigning values to a test vector sequence to satisfy the requirement that an error signal must propagate through a dominator gate in order to be detectable (targeted-D propagation), (b) preventing unnecessary searches through the use of minimizing previously made test vector assignments to eliminate assignments that are not necessary, and (c) using fault simulation of previously generated test vectors to identify and generate test vectors for previously undetected faults.

BRIEF DESCRIPTION OF THE DRAWINGS

FIG. 19 is an illustration of the operation of the Justify From Known PPI routine of the present invention upon an ILA model of a digital circuit.

DESCRIPTION OF THE PREFERRED EMBODIMENT

SYSTEM OVERVIEW

Figure 1:
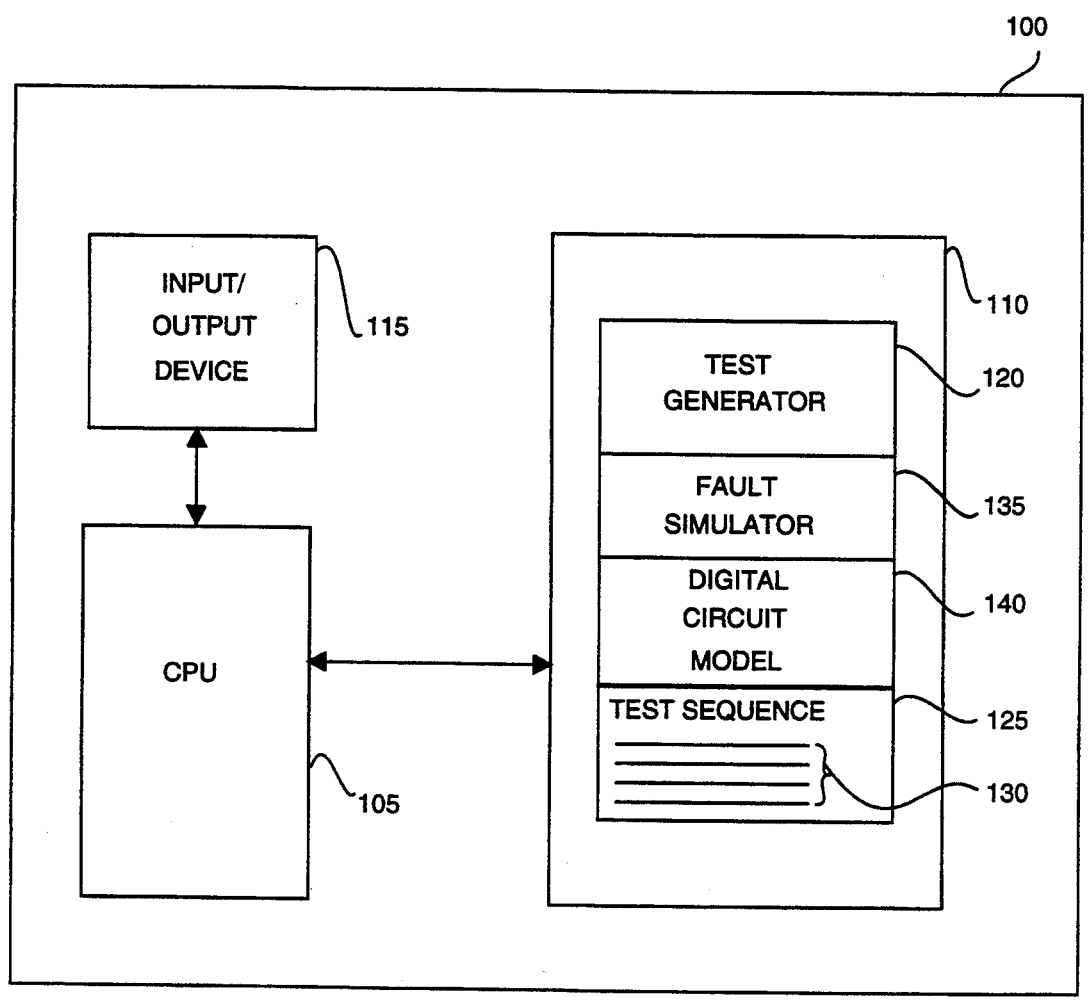
FIG. 1 is a diagram of the test vector generation system of the present invention.

Referring now to FIG. 1, there is shown an embodiment of the present method and system 100 for generating input sequences for testing an integrated digital circuit. The system 100 comprises a central processing unit (CPU) 105, a memory 110, and an input/output (I/O) device 115. The CPU 105 is connected to the memory 110 so that it can store data therein, and retrieve data therefrom. This connection also allows the CPU 105 to execute programs stored in the memory 110. The CPU 105 is further connected to the I/O device 115 which allows a user (not shown) to communicate with the CPU 105 and, through the CPU 105, with the memory 110. The preferred embodiment has been implemented on a SPARC Station 2, manufactured by Sun Microsystems, Inc. Configurations of this and other comparable computer systems are well known in the art and need not be described here in detail.

The system 100 also contains a test generator 120 which, in the preferred embodiment, is a program stored in the memory 110 for controlling the CPU 105. The test generator 120 produces a test sequence 125 comprising primary input vectors 130 which are data values to be applied sequentially as input signals to a digital circuit (not shown). Faults within the digital circuit are indicated by a difference between the output of the digital circuit, after the input test sequence 125 is applied, and an expected output value generated by the test generator 120.

The system 100 also contains a fault simulator 135 which, in the preferred embodiment, is a program stored in the memory 110 for controlling the CPU 105. The fault simulator 135 uses a digital circuit model 140 which is also stored in the memory 110. The digital circuit model 140 is a digital computer representation of the circuit to be tested in terms of data structures and/or programs. The fault simulator 135 is able to use the digital circuit model 140 to simulate the operation of the circuit to be tested under conditions in which a fault is present. The fault simulator 135 is also capable of simulating the application of the test sequence 125 to the circuit to be tested, in order to determine not only which set of faults are detectable by the test sequence 125, but also a set of nodes within the circuit being tested to which an error signal has propagated without arriving at an output of the circuit being tested.

The present system 100 is operable with any known fault simulator that functions as described. A preferred fault simulation algorithm for use with the system 100 is described in Chapter 6 of the attached Appendix A.

The software for the test generator 120 and the fault simulator 135 was written in the C++ programming language. Additionally, one of the program modules used the lex programming language. The structure of the software for the test generator 120 and the fault simulator 135 is as shown in Chapter 4 of the attached Appendix A.

DETAILS OF SYSTEM OPERATION

1. Test Generation Strategy

Figure 2:
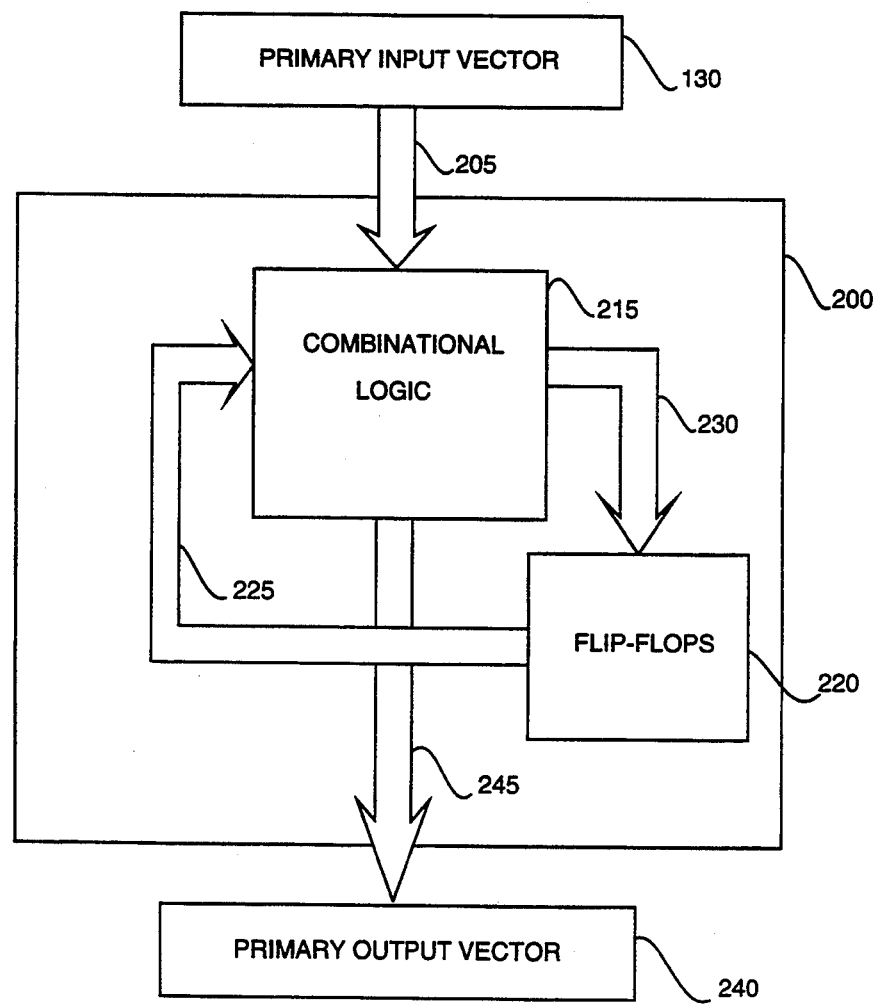
FIG. 2 is a diagram of a sequential digital circuit for which test vectors may be generated by the present invention.

Referring to FIG. 2, a sequential digital circuit 200 to be tested is depicted. The circuit contains a primary input node 205 for receiving a primary input vector 130 consisting of a string of binary information represented as signal values. Internally, the digital circuit 200 comprises combinational logic 215 interconnected with flip-flops 220. The output of the flip-flops 220 represents the present state 225 of the digital circuit 200, and is used as an input to the combinational logic 215. The next state 230 of the digital circuit 200 is an output of the combinational logic 215, and is connected to the input of the flip-flops 220. The combinational logic 215 is also connected to a primary output node 245, for outputing a primary output vector 240 from the digital circuit 200. The primary output vector 240 consists of a string of binary information represented as signal values.

The digital circuit 200 may have a "stuck-at" fault, that is, a node within the digital circuit 200 that propagates a constant signal level regardless of the control signals being applied to that node. Such faults may be caused by shorted or broken connections within the digital circuit 200. The object of test generation is to produce a test sequence 125 of primary input vectors 130 that will cause a stuck-at fault to appear at a primary output node 245 as a primary output vector 240 having a signal value that is different from that which would normally be expected from the input test sequence 125.

The presence of the flip-flops 220 in the digital circuit 200 makes test generation more difficult than for circuits comprising only combinational logic, because several clock cycles may be required before a signal at a particular node within the digital circuit 200 can be flushed to a primary output node 245. Consequently, a sequence of primary input vectors 130 will have to be generated, each to be applied in consecutive clock cycles to the digital circuit 200. In accordance with the present invention, the generation of this test sequence 125 of primary input vectors 130 is carried out by modeling the digital circuit 200 as one comprising only combinational logic elements, as shown in FIG. 3.

Figure 3:
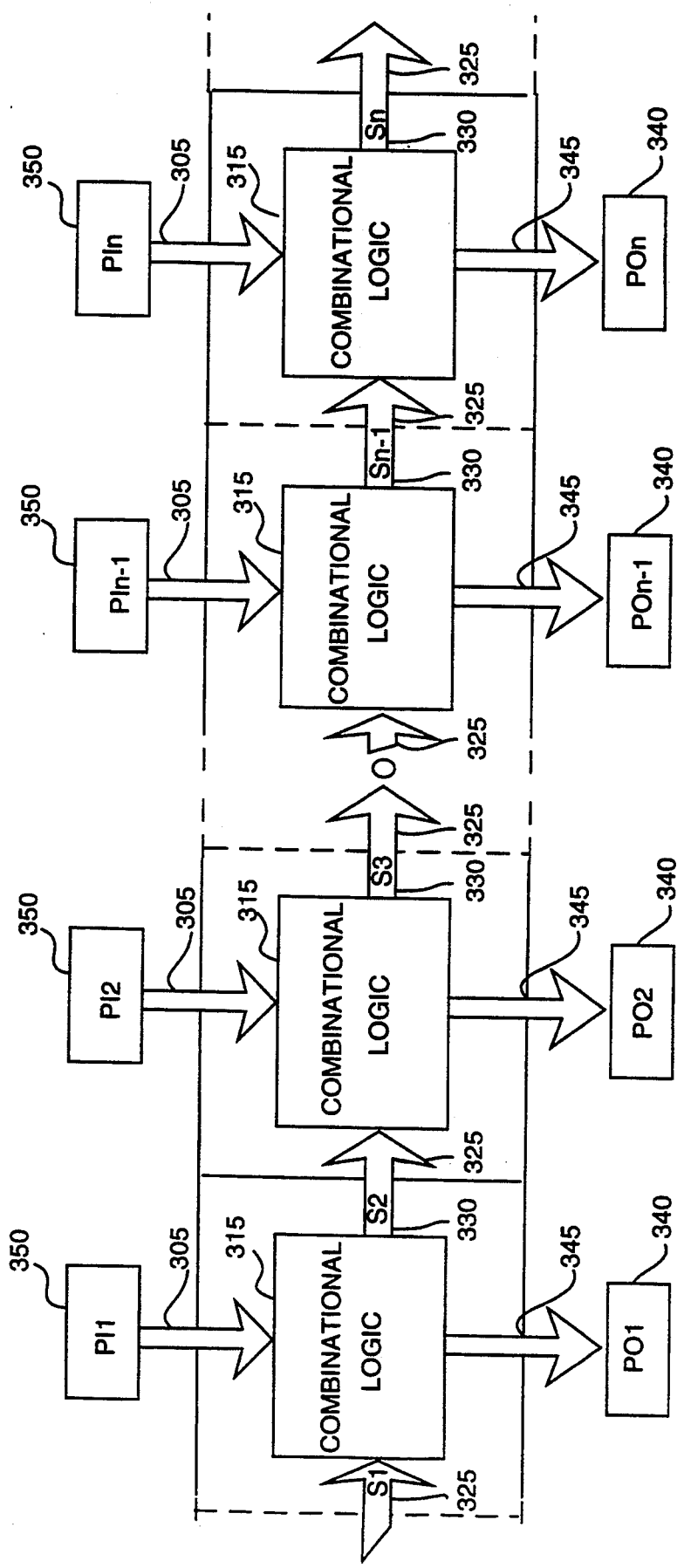
FIG. 3 is an illustration of an iterative logic array (ILA) model of the digital circuit of FIG. 2.

Referring now to FIG. 3, an iterative logic array (ILA) model 300 of the sequential digital circuit 200 is shown. This modeling technique is also known as time-frame expansion. A discussion of ILA modeling of sequential circuits is presented by Abramovici, Breuer and Friedman in their book Digital Systems Testing and Testable Design, published by Computer Science Press, New York, N.Y. 1990, ISBN 0-7167-8179-4). In the ILA model 300, the flip-flops 220 of the digital circuit 200 are completely eliminated, leaving only combinational logic 315. The ILA model 300 consists of identical stages 310 of combinational logic 315 coupled to one another, where each stage 310 represents the digital circuit 200 during a particular time frame. The combinational logic 315 of the ILA model 300 corresponds to the combinational logic 215 of the digital circuit 200. The primary input (PI) vectors 350 appearing at the PI nodes 305 of each stage 310 correspond to a sequence of PI vectors 130 presented in corresponding time frames to the PI node 205 of the digital circuit 200. Similarly, the primary output (PO) vectors 340 appearing at the PO nodes 345 correspond to a sequence of PO vectors 240 that would be output in corresponding time frames from the PO node 245 of the digital circuit 200.

The present state 225 and the next state 230, presented respectively at the output and input of the flip-flops 220, have been replaced by corresponding pseudo-primary input (PPI) nodes 325 and pseudo-primary output (PPO) nodes 330 in each stage 310. The PPO node 330 of each stage 310 is coupled to the PPI node 325 of the next stage in the ILA model 300.

Figure 4:
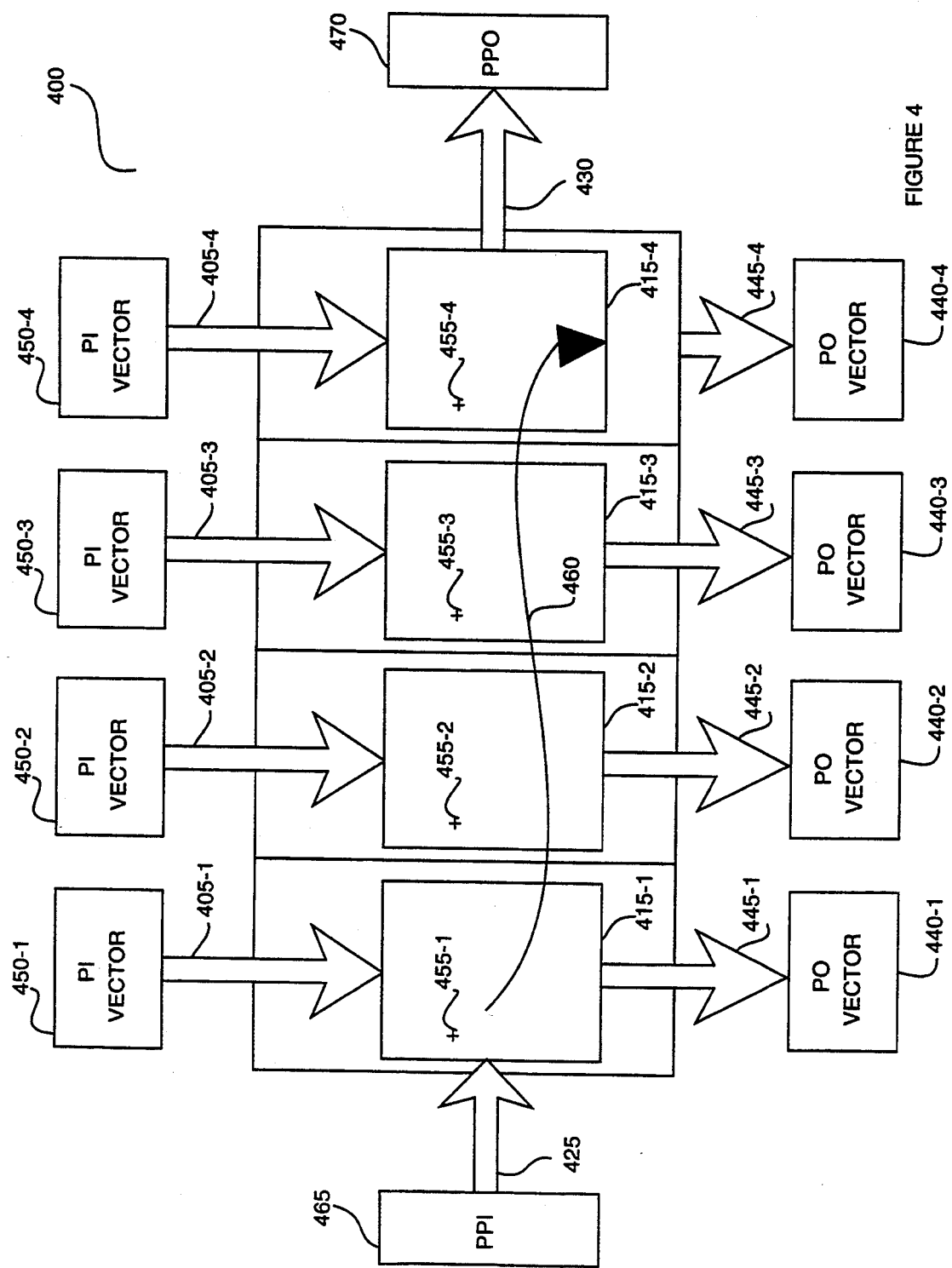
FIG. 4 is a diagram of an ILA model of a digital circuit in which a path from a faulty node to a primary output (PO) has been sensitized by primary input (PI) and pseudo primary input (PPI) vector assignments.

Referring now to FIG. 4, an ILA model of another digital circuit 400 containing a faulty node 455 is shown. Because the fault is present through multiple time frames of operation of the digital circuit 400, the faulty node 455 is present in each stage 410 of the ILA model of the digital circuit 400. According to the present invention, the test generator 120 determines the sequence of PI vectors 450 that will cause a PO vector 440 to contain an error signal corresponding to the signal present at the faulty node 455. The path of the error signal from the faulty node 455, through the combinational logic 415, to the PO node 445 is depicted as the arrow 460. Typically, the PPI vector 465 that is applied to the PPI node 425 at the start of the test is unknown because it is a function of the state that the digital circuit 400 was last left in. In such a case, the test generator 120 must determine a path 460 that can be completely controlled by the sequence of PI vectors 450 that are applied. In other cases, the initial PPI vector 465 is known. This can occur when the test generator 120 is aware of what PI vectors 450 were previously applied to the digital circuit 400. In this event, the test generator may be able to use this information to more easily determine the necessary sequence of PI vectors 450 that will enable a path 460.

There are two main techniques for generating tests for sequential circuits using the ILA model. The first approach is to expand the model backwards by adding stages 310 to the model that correspond to earlier time frames. This is called reverse time processing. The paradigm of reverse time processing consists of starting with a desired set of conditions in the circuit, and determining the necessary PI vectors 450 that must be applied to previous stages 410 to set up those conditions.

The second approach for using the ILA model to generating tests is to expand the model forwards by adding stages 310 to the model that correspond to later time frames. This is called forward time processing. The paradigm of forward time processing consists of starting with a desired set of conditions in the circuit, such as the presence of an error signal at a node, and determining the necessary PI vectors 450 that must be applied to later stages 410 to produce a desired condition. When forward time processing is used in test generation, it must usually be followed by reverse time processing to fully establish the set of PI vectors 450 that will be required to detect a particular faulty node 455.

Prior techniques using reverse time processing and forward time processing to generate test sequences, as well as the drawbacks with each of these techniques, are more fully described in section 2.4 of the attached Appendix A. The present invention is able to overcome these drawbacks.

2. Targeted-D Technique

Figure 5:
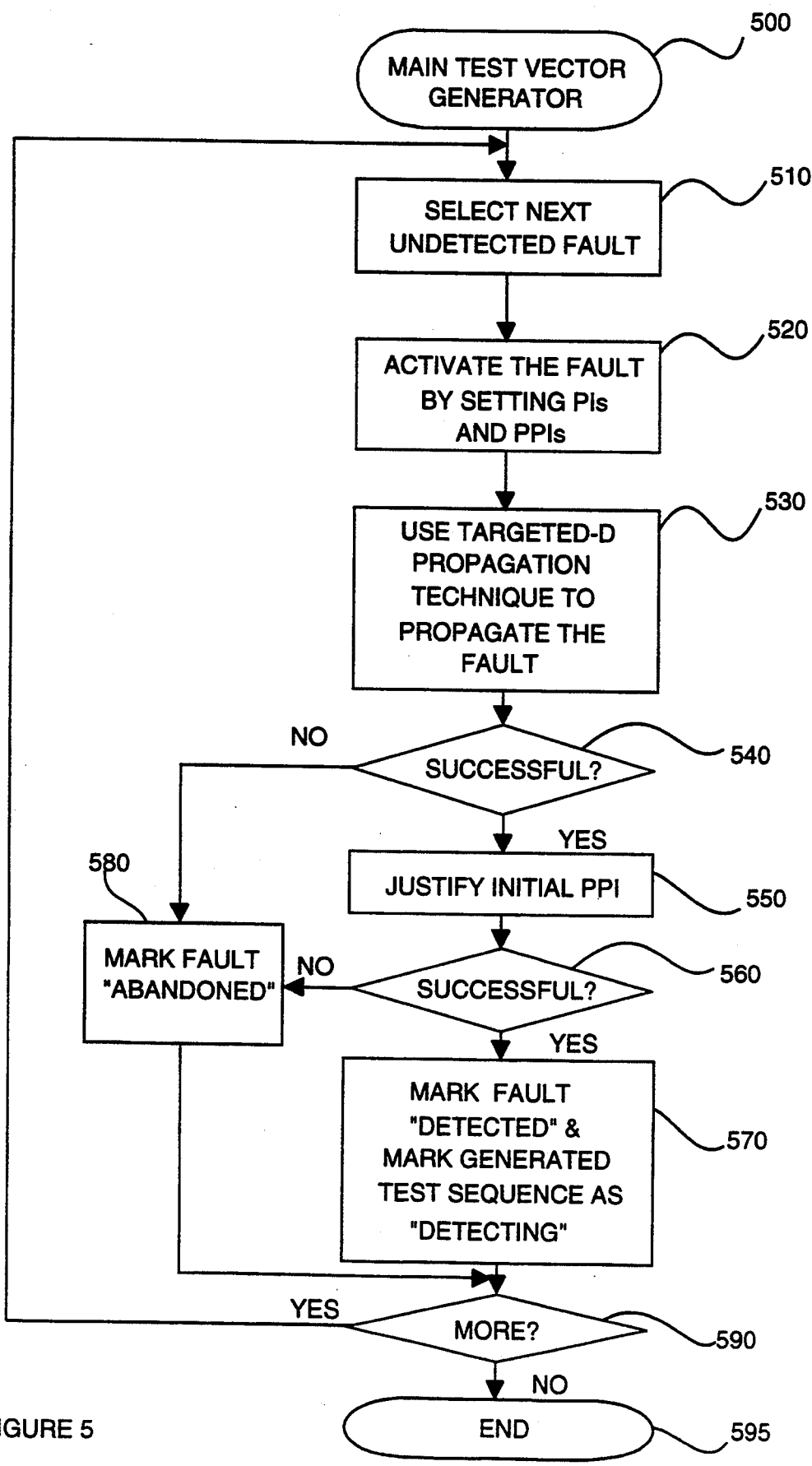
FIG. 5 is a flow chart of the main test vector generator operation of the present invention.
Figure 6:
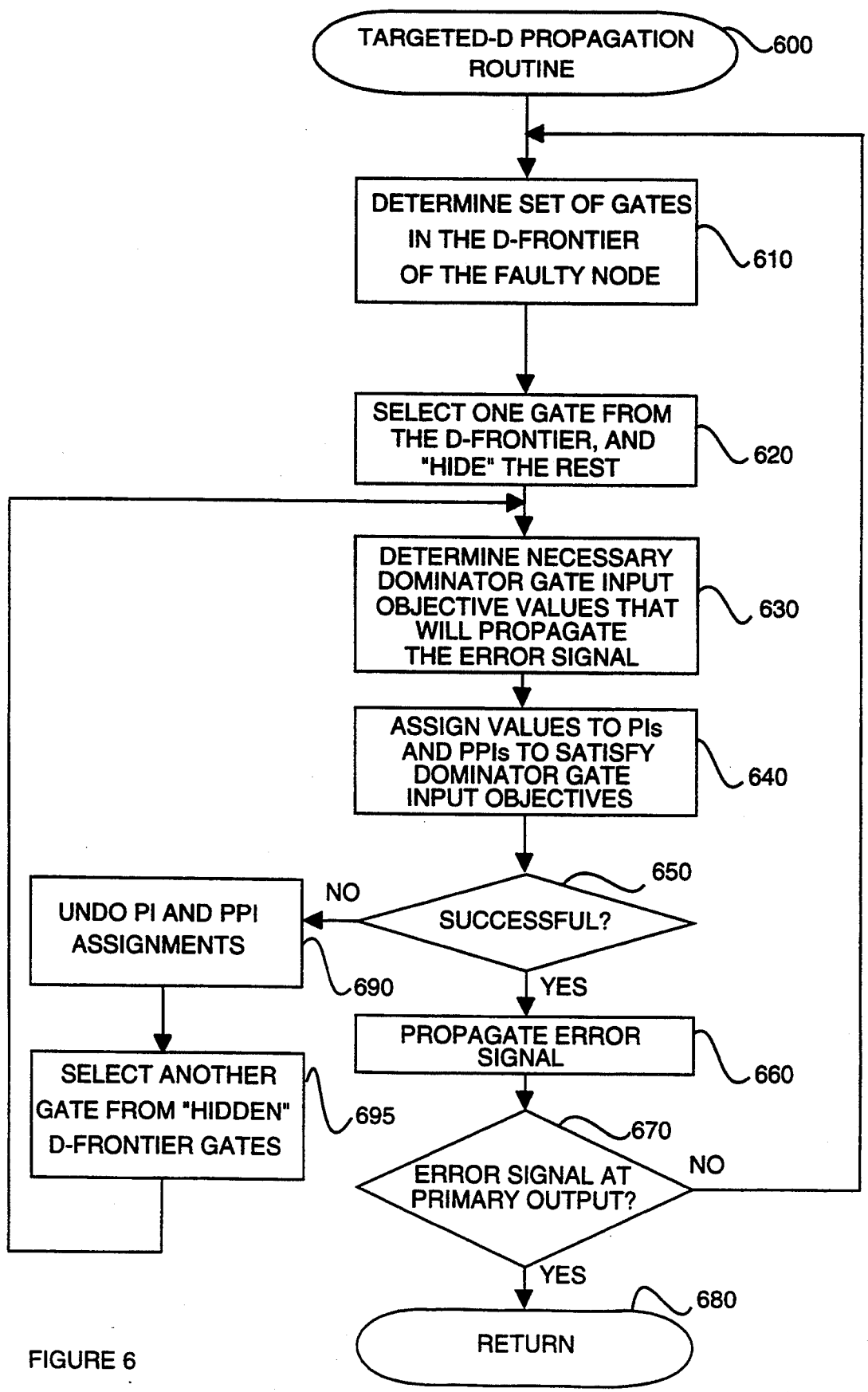
FIG. 6 is a flow chart of the targeted-D propagation routine operation of the present invention.

A flow chart of the operation of an improved test vector generator built in accordance with the present invention is shown in FIGS. 5 and 6. The steps for generating test vectors as shown in FIGS. 5 and 6 will be explained, by way of example, in conjunction with FIG. 7 which shows two stages, 710-1, 710-2 of an ILA model of a sequential circuit 700 to be tested.

Referring back to FIG. 5, the main test vector generator 500 is a sequence of operations to be performed as part of the test generator 120 of FIG. 1. The ILA model of the sequential circuit 700 is stored as the digital circuit model 140 in the memory 110 (see FIG. 1). The function of the main test vector generator 500 is to take a list of fault sites within the digital circuit 700, and to generate a test sequence 125 that will allow a fault at the fault site to be detected at a PO in the circuit. If a test sequence 125 is successfully generated, then the main test vector generator 500 records the fact that this fault is detectable, and also records the generated test sequence that detects the fault. If the main test vector generator 500 cannot successfully generate a test sequence for this fault, then the fault is marked as abandoned, meaning that the main test vector generator 500 has stopped trying to generate a test sequence that will detect the fault. The test generator 120 can be configured to abandon a fault if the Main Test Vector Generator 500 is taking too long to generate a test sequence. The preferred embodiment of the present invention utilizes a progressive time limit to control the operation of the test generator 120. This is described in section 5.1 of the attached Appendix A. The Main Test Vector Generator 500 will now be described in more detail.

Figure 7:
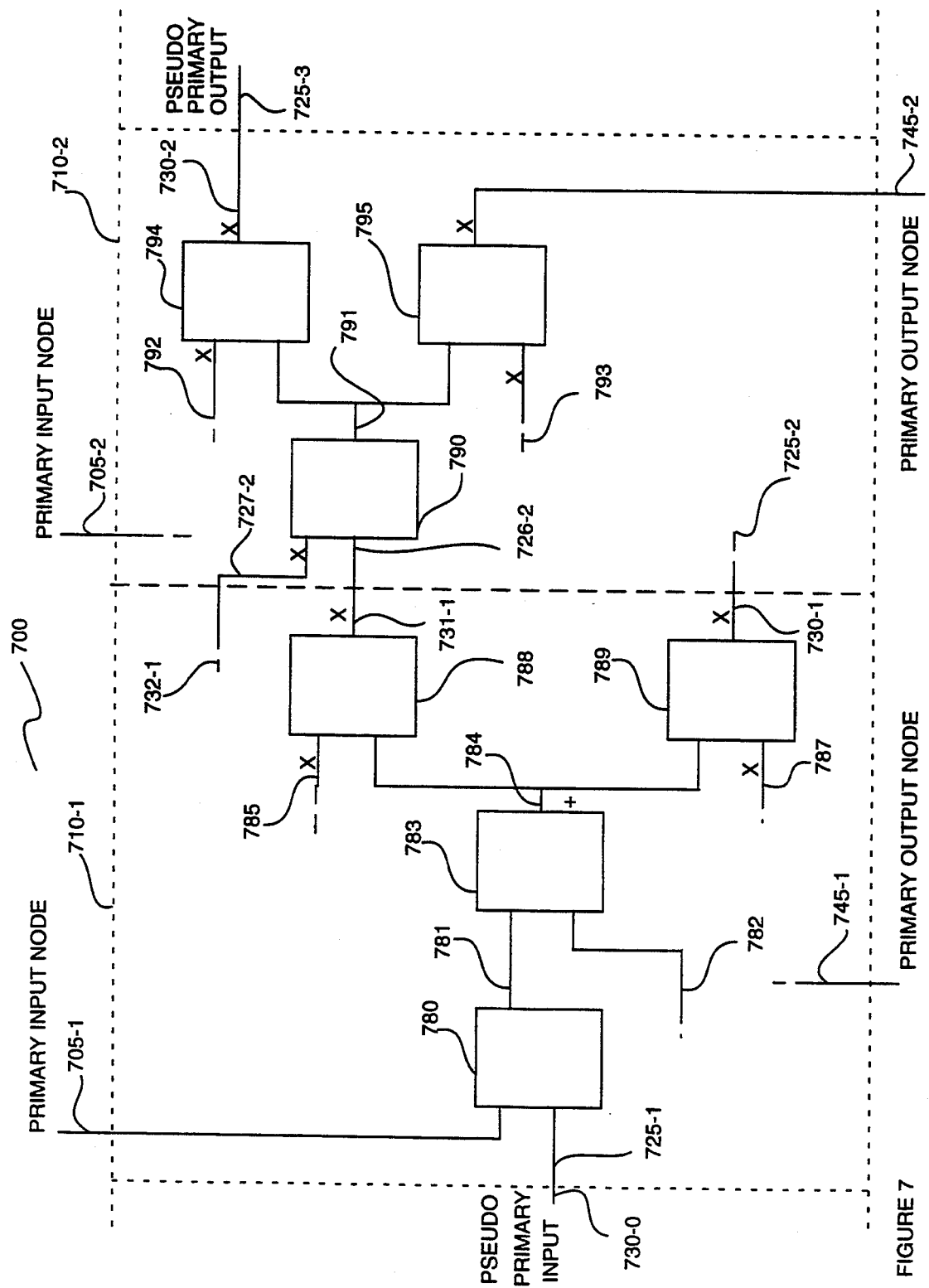
FIG. 7 is an illustration of a digital circuit, modeled as an ILA expansion, in which the main test vector generator of the present invention is operating.

For purposes of example, the digital circuit 700 shown in FIG. 7 will be used as the input model to the Main Test Vector Generator 500. The boxes 780, 783, 788, 789, 790, 794, 795 in FIG. 7 represent various logic gates in the digital circuit 700, and need not all represent the same kind of logic gate. Two stages 710-1, 710-2 of the ILA model are shown.

Referring to FIG. 5, the Main Test Vector Generator 500 begins execution at block 510, where it selects a node in the digital circuit 700 to be tested, for which no attempt has yet been made to generate a test sequence 130. This discussion will assume that node 784 has been selected to be the faulty node in this step. Next, in block 520, the main test vector generator 500 performs the step of activating the fault by setting PIs and PPIs. The term "activating a fault" means setting a stuck-at signal value at the faulty node (represented by the "+" at faulty node 784), and setting the necessary PI 705-1 and PPI 725-1 signal values that would generate, in a non-faulty circuit, a value at faulty node 784 that is the complement of the stuck-at value. For example, if the stuck-at value at faulty node 784 is a "0" and gate 783 is an AND gate, then the "activate fault" block 520 will make necessary signal assignments to PI node 705-1 and PPI node 725-1 that will generate a value of "1" at the two input nodes 781 and 782. These signals would establish conditions which would cause a "1" to appear at faulty node 784 were it not for the fact that faulty node 784 has a stuck-at 0 fault.

Next, in block 530, the main test vector generator 500 executes a targeted-D propagation technique to establish PI node 705-1, 705-2 and initial PPI node 730-0 conditions that will cause the signal at faulty node 784 to control the signal value at any PO node 745-x, thus serving as an indicator of the presence or lack of a fault at the faulty node 784. In our example, a 0 at the primary output would indicate the presence of a stuck-at 0 fault at faulty node 784. A 1 at the primary output would indicate the lack of a stuck-at 0 fault under these test conditions, because it would show that the input PI node 705-1, 705-2 and PPI node 725-1 signal values were able to force a value of 1 to appear at the "faulty" node 784.

Referring now to FIG. 6, the targeted-D propagation routine is shown in more detail. As just explained, its function is to condition the digital circuit 700 so that an error signal will propagate from the faulty node 784 to any PO 745-x. The error signal has a composite logic value comprising a first value if the node has a stuck-at fault, and a second value if the node has no stuck-at fault. For this reason, the error signal is often called a "difference signal," represented by the letter "D". The targeted-D propagation routine derives its name from the fact that it selects, or "targets," certain gates within the digital circuit 700 through which it tries to propagate the error signal, or "D."

Block 600 is the entry point to the targeted-D propagation routine. The first block to be executed is block 610, in which the test generator 120 determines which gates in the digital circuit 700 make up the D-frontier of the faulty node 784. The D-frontier is defined as the set of all gates whose output value is currently unassigned but which have one or more error signals on their inputs. During fault propagation processing, several gates may be included in the D-frontier. In our example, The D-frontier is comprised of gates 788 and 789 in FIG. 7, because the error signal, or "D," at faulty node 784 appears as an input to these gates, and the other input nodes 785, 787, have unassigned values (represented by the letter "X"), leaving the signals on the output nodes 731-1, 730-1 unassigned.

Next, in block 620, the targeted-D propagation routine 600 selects one of these gates to be the target-D element that it will work with, and stores the remainder of the list in the system memory 110. The existence of these other gates is thus temporarily "hidden" from the remainder of the targeted-D propagation routine 600. For a successful fault propagation all that is necessary is to propagate one error signal to a PO, so the targeted-D propagation routine 600 may never have to analyze paths through the "hidden" gates. In our example, we will assume that the targeted-D propagation routine 600 has selected gate 788, and "hidden" the existence of gate 789.

Next, the operation of block 630 utilizes the concept of a dominator gate. A dominator gate is defined as a gate through which a signal must pass in order to reach any primary output in the digital circuit. In block 630, the targeted-D propagation routine 600 locates the set of dominator gates for the error signal, and determines the signal values that must appear at the other inputs to the dominator gates in order for the error signal to propagate to the output node of the dominator gate. The reason for this step is because finding a set of PI 705-$x$ values that will cause the error signal to propagate from the faulty node 784 to a PO 745-$x$ is a trial and error search procedure. Because the error signal must, by definition, propagate through a dominator gate to reach a PO 745-$x$, setting up mandatory conditions to accomplish this can narrow the search space. The step, in block 620, of selecting only one D-frontier gate from the set of all D-frontier gates operates to increase the number of mandatory conditions, and therefore further narrows the search space, because it causes a D-frontier gate to be treated like a dominator gate even if it is not one. It should be noted that the targeted D element provides only temporary objectives to the search mechanism; it does not inhibit the implications of untargeted D elements. In fact, the forward implication procedure always includes all D's, and hence faults requiring multiple D's are still identified.

Continuing with the example in which gate 788 of FIG. 7 was selected in block 620, the processing in block 630 would determine that blocks 788, and 790 are dominator gates, because the error signal at the input of gate 788 must pass through gates 788, 790 to reach a PO 745-2. Note that in actuality, gate 788 may not be a dominator gate because a path through gate 789 may also lead to a PO 745-$x$. After making this determination, processing continues at block 640.

In block 640, the targeted-D propagation routine 600 assigns values to the PI and PPI vectors that will generate the signal values determined in block 630 for the inputs to the dominator gates. These assignments are made using backward and forward logical implications on propagating signal values selected for the unassigned input nodes 785, 727-2 of the dominator gates 788, 790. The propagating signal values selected for the input nodes 785, 727-2 must be non-controlling values (i.e., 1's for AND and NAND gates, and 0's for OR and NOR gates), in order to ensure that the value of the signal on the output node of the dominator gate is directly related to the value of the error signal on the input node. The remaining input node signal assignments that are made to the PI nodes 705-$x$ and PPI node 725-1 can be determined by backward and forward logical implications on those noncontrolling propagating signal values selected for the dominator gate input nodes 785, 727-2. The implication process is conventional, and is found described by Abramovici, Breuer and Friedman in their book Digital Systems Testing and Testable Design, published by Computer Science Press, New York, N.Y. 1990, ISBN 0-7167-8179-4).

Next, in block 650, a test is performed to see whether signal values were successfully assigned to PI nodes 705-$x$ and PPI node 725-1 that would set up the mandatory noncontrolling values for the dominator gate input nodes 785, 727-2. Failure is possible because the existence of signals having the mandatory noncontrolling values at dominator gate input nodes 785, 727-2 may not be possible in light of other signal assignments already made to nodes in the digital circuit 700. If the processing in block 640 successfully made signal assignments to PI nodes 705-$x$, or PPI node 725-1, or both, that would establish the mandatory noncontrolling signal values at dominator gate input nodes 785, 727-2 then processing continues at block 660. If the processing of block 640 was not successful, then processing continues at block 690.

In block 660, it has been determined that signal assignments were successfully made to PI nodes 705-$x$, or PPI node 725-1, or both, that would establish the mandatory noncontrolling signal values at dominator gate input nodes 785, 727-2. Therefore, the main test vector generator 500 emulates the propagation of the error signal through the dominator gates 788, 790. Next, at block 670, a test is performed to see whether the error signal has yet arrived at a PO 745-2. If yes, then the targeted-D propagation routine 600 has successfully made signal value assignments to PI nodes 705-$x$, or PPI node 725-1, or both, that cause the error signal to propagate from the faulty node 784 to a PO 745-2. Processing then continues at block 680, which is a return to the main test vector generator 500.

In our example, success in block 640 would cause the error signal to propagate through gates 788 and 790. Although the error signal has made it to node 791, it cannot propagate through either of gates 794 or 795, because both of their respective other inputs 792, 793 have unassigned signal values (X). Therefore, the output nodes of these gates 794, 795 also have unassigned signal values (X), and node 791 appears as a new "faulty" node with the successor gates 794, 795, having unassigned respective input nodes 792, 793, comprising the D-frontier. Consequently, in our example, processing would continue from block 670 back to block 610, where the loop is repeated in an attempt to make further assignments to PI nodes 705-$x$, or PPI node 725-1, or both, that will cause the error signal to propagate to a PO 745-2. This loop will repeat either until it is determined that no signal value assignments to PI nodes 705-$x$, or PPI node 725-1, or both, can be made that will cause the error signal to propagate to a PO 745-2, or until a test generator timeout (not shown) occurs, causing the main test vector generator 500 to "abandon" the attempt to detect this stuck-at fault at faulty node 784.

If the determination is made, in block 650, that no signal value assignments to PI nodes 705-$x$, or PPI node 725-1, or both, can be made that will cause the error signal to propagate through the dominator gates 788, 790, then processing continues at block 690, where the targeted-D propagation routine removes any signal value assignments that were made during the processing of block 640. This puts less specification on the PI node 705-$x$ and PPI node 725-1 signal assignments, thus creating two benefits. First, by having fewer PI node 705-$x$ and PPI node 725-1 signal assignments, the chance of success during the next pass through the targeted-D propagation routine 600 is increased. Second, having fewer assigned 1's and 0's, the PPI node 725-1 signal assignment is easier to justify in the main test vector generator 500. The justification process is described below, and in the attached Appendix B.

Next, in block 695, the targeted-D propagation routine 600 selects, from the set of D-frontier gates previously stored in memory (see block 620), another gate to treat as a dominator gate, keeping the remainder of the list of D-frontier gates still "hidden" in memory. This choice is made on the basis of selecting the most observable D-frontier gate remaining in the list. Observability is the measure of the ability to determine the signal value at any node in a circuit by controlling the circuit's inputs and observing its outputs. Processing continues back at block 630, where the targeted-D propagation routine 600 begins again to attempt to make PI node 705-x and PPI node 730-0 signal assignments that will cause the error signal at faulty node 784 to propagate to a PO 745-x. Because all previous assignments were undone in block 690, the processing for the newly selected D-frontier gate is carried out by the targeted-D propagation routine 600 as if it had been selected initially.

In the example shown in FIG. 7, an ILA model of digital circuit 700 is shown having only a two stage (time frame) expansion. This is for the purpose of example only. In actual processing, the test generator 120 might add more stages 710-x to the right side of the ILA model of the digital circuit 700, during forward time processing, or to the left side of the ILA model of the digital circuit 700 during reverse time processing, in an attempt to make assignments that will cause the error signal to propagate from the faulty node 784 to a PO 745-x at stage 710-x.

Referring back now to FIG. 5, the return from the targeted-D propagation routine 600 leads to execution of block 540. Block 540 is a test to see whether PI node 705-x and PPI node 730-0 assignments were made that will cause the error signal at faulty node 784 to propagate to a PO 745-x. If assignments were not made, the processing continues at block 580, where this fault is marked as "abandoned," meaning that the main test vector generator was not able to produce a test sequence 130 for this particular fault. From block 580, execution continues at block 590, where the main test vector generator 500 determines whether there are any more faults for which it must attempt to generate test sequences 130. If there are more faults, then the entire loop is repeated, beginning at block 510. Otherwise, the routine ends at block 595.

If, however, the targeted-D propagation routine, called from block 530, was successful, processing continues at block 550, where a process called initial PPI vector justification occurs. This will next be explained.

3. Initial PPI Vector Justification

The signal assignments that were made to the PPI node 730-0 during the targeted-D propagation routine make up what is called an initial PPI vector. When the initial PPI vector is applied to the digital circuit 700 in conjunction with all of the PI node 705-1 through 705-x signals for which assignments were made, an error signal at a faulty node 784 will propagate to a PO 745-x. However, the PI node 705-1 through 705-x signal assignments actually represent a sequence of individual PI node 705-i (i=1 to x) vectors that would have to be applied in successive clock cycles to the actual digital circuit 200 in FIG. 2, in order to cause the error signal to propagate from a faulty node to a PO 245. Furthermore, the assignments made by the targeted-D propagation routine 600 to the PPI node 730-0, which will be referred to as the initial PPI vector 730, actually represent the present state 225 of the digital circuit 200. For the sequence of PI vectors 705-1 through 705-x that were generated by the targeted-D propagation routine 600 to be an effective test sequence 130 of the digital circuit 200, the digital circuit 200 must first be put into a present state 225 represented by the initial PPI vector 730 that was generated by the targeted-D propagation routine 600. However, unlike the PI vector 130 applied to the PI node 205, the present state 225 of the sequential digital circuit 200 usually cannot be directly set by applying a data vector from a source external to the digital circuit 200. It may be possible, however, to get the digital circuit 200 into the desired present state 225, represented by the initial PPI vector 730, by applying a sequence of one or more PI vectors 130 to the digital circuit 200 when the digital circuit 200 starts out in a known present state (i.e., a known PPI vector). The known present state may be actually known, as where the digital circuit 200 is left in a predictable state from a previously applied sequence of PI vectors 130, or the known state may simply be known to be unpredictable. The process of determining the sequence of PI vectors 130, for a known present state, that when applied sequentially to the digital circuit 200 will cause the present state 225 of the digital circuit 200 to be equal to the generated initial PPI vector 730 is called initial PPI vector justification. Experience shows that the state justification step is one of the most time consuming computations in an automatic test generation system. The initial PPI vector 730 that needs to be justified is represented by logic 0, 1 and X (unknown, unassigned, don't care) signal values on the PPI vector 730 in the ILA model of a sequential digital circuit 700. The more PPI signal values remain unassigned, i.e., more X's in PPI vectors 730, the easier the justification process is.

Referring again to FIG. 5, the step of justifying the initial PPI vector, produced by the targeted-D propagation routine, is invoked. PPI vector justification may be performed by adding stages (time frames) using reverse time processing on the ILA model of the digital circuit 700, in a process utilizing conventional logical implication techniques described by Abramovici, Breuer and Friedman in their book Digital Systems Testing and Testable Design, published by Computer Science Press, New York, N.Y. 1990, ISBN 0-7167-8179-4). An ILA model of a sequential digital circuit 800 in which reverse time processing has been used for initial PPI vector justification is depicted in FIG. 8.

Figure 8:
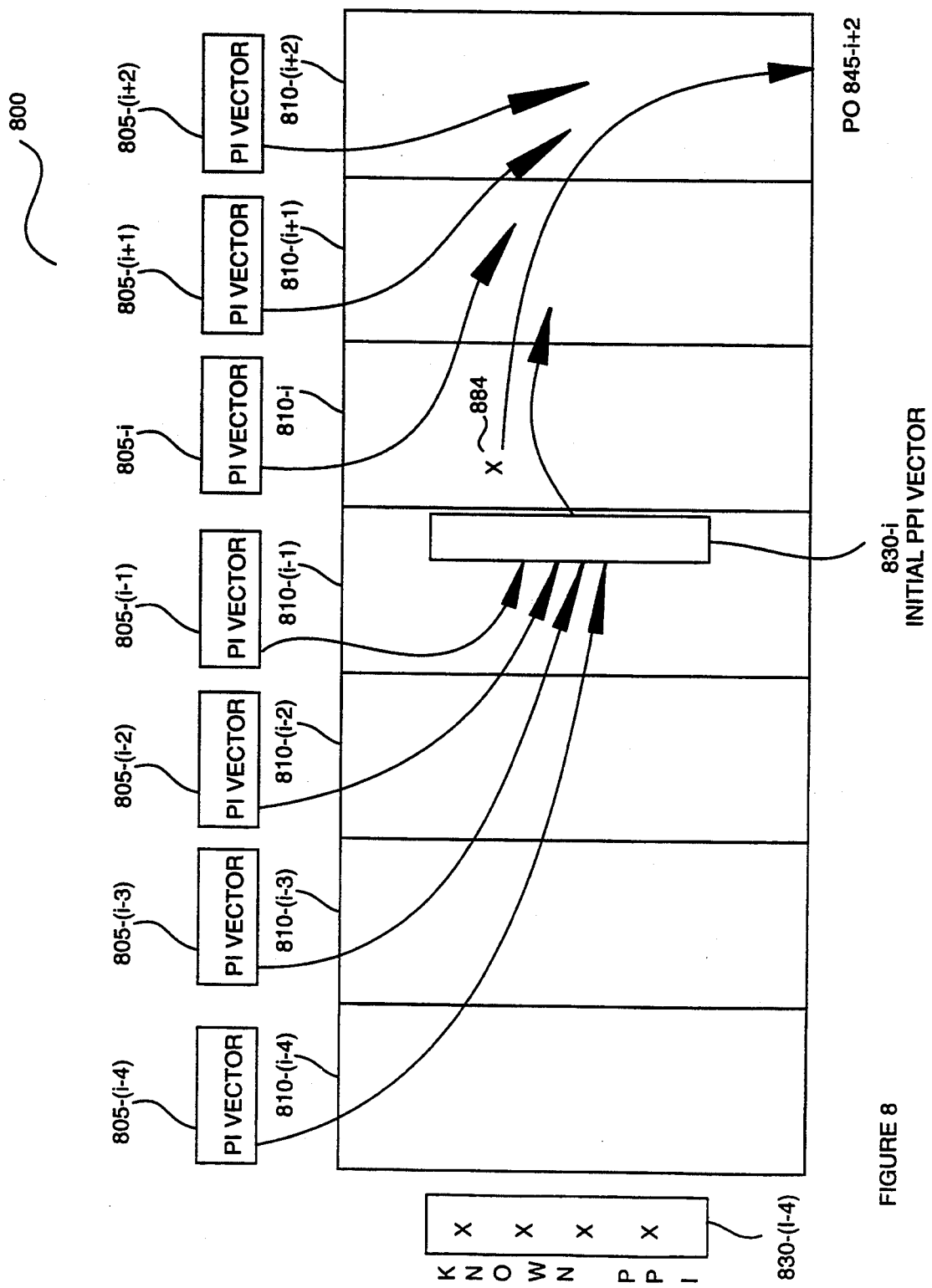
FIG. 8 is an illustration of a digital circuit, modeled as an ILA expansion, in which an initial PPI vector (initial state) justification method of the present invention is operating.

Referring now to FIG. 8, the ILA model of the sequential digital circuit 800 is shown having seven stages (time frames) 810-(i−4), 810-(i−3), . . . , 810-i, 810-(i+1), 810-(i+2). Stage 810-i represents the stage for which the initial PPI vector 830-i has been calculated by the targeted-D routine 600. The PI vectors 805-i, 805-(i+1), 805-(i+2) were also generated by the targeted-D routine 600 for causing a stuck-at fault at node 884 to propagate to the PO 845-(i+2). Starting with the initial PPI vector 830-i as a mandatory signal assignment at the PPI node of stage 810-i, reverse time processing including logical implication techniques are used to determine a sequence of PI vectors 805-(i−4), 805-(i−3), 805-(i−2), 805-(i−1) that will generate the initial PPI vector 830-i, regardless of the value of the known PPI vector 830-($i-4$). In other words, the known PPI vector 830-($i-4$) is a vector of X's (don't cares).

Figure 9:
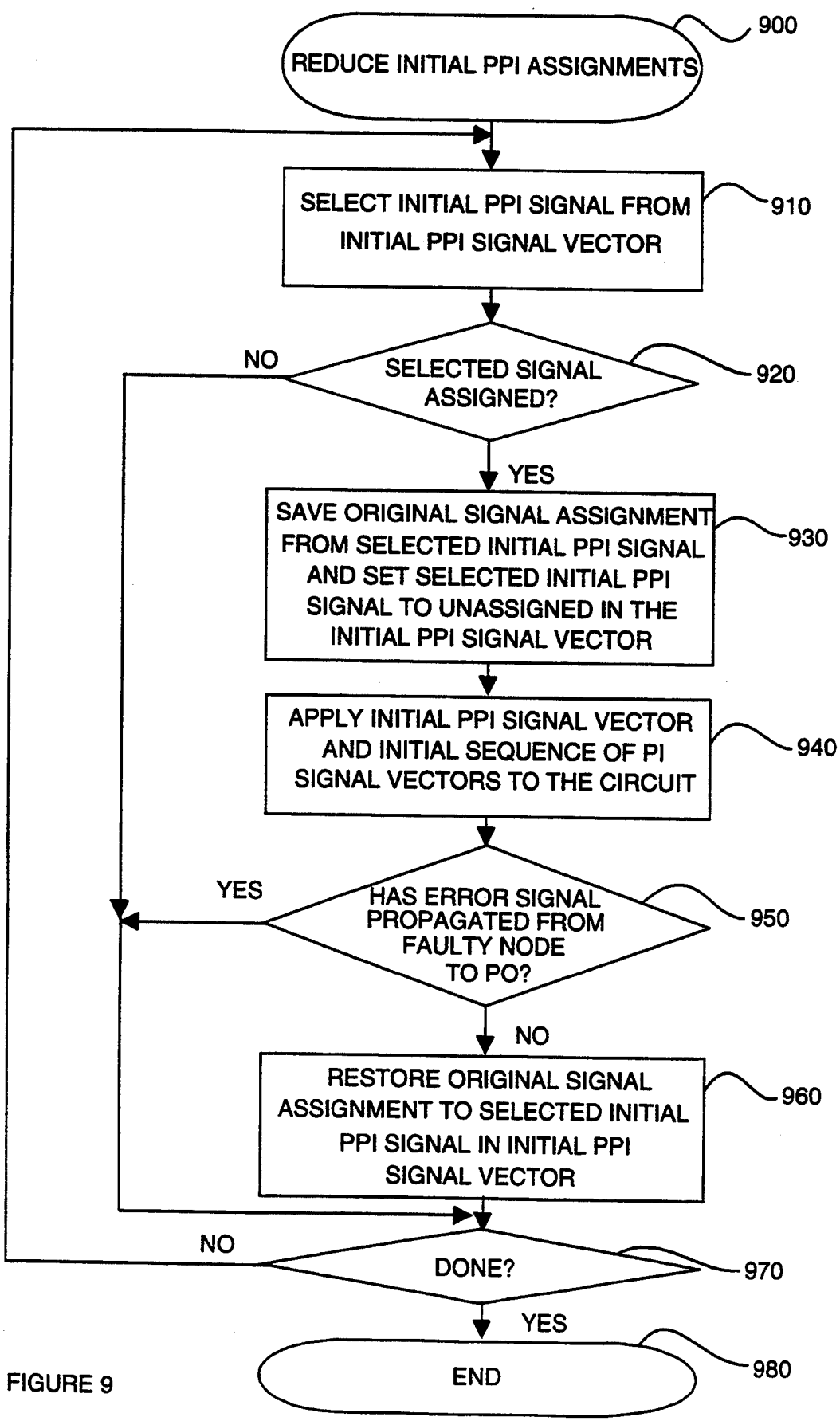
FIG. 9 is a flow chart of the Reduce Initial PPI Assignments routine of the present invention.

As was previously stated, the more X's that are assigned to the initial PPI vector 830-$i$, the easier the justification process is. In the preferred embodiment of the present invention, the justification process includes a first step of reducing the number of assigned signal values (thus increasing the number of assigned X's) in the initial PPI vector 830-1. A flow chart of the reduce initial PPI vector assignments routine is shown in FIG. 9. The process is performed for both the fault-free and the faulty machines.

4. Reducing Initial PPI Assignments

Referring now to FIG. 9, the reduce initial PPI assignments routine 900 begins at block 910, where one of the signals that comprise the initial PPI vector 830-$i$ is selected. Next, in block 920, the selected signal is tested to see whether a value was assigned to that signal during the target-D propagation routine 600. If the selected signal is unassigned (i.e., equal to X), then there is nothing more to do to it. Processing continues at block 970, which checks to see whether all initial PPI vector signals have been processed by the reduce initial PPI assignments routine 900. If the test is affirmative, then processing continues at block 980, which returns to the justify initial PPI routine 550. If the test at block 970 is negative, then processing returns to block 910, where another signal is selected, and the same sequence of steps is begun.

Returning back to block 920, if the selected PPI signal has an assigned value, then processing continues at block 930. In block 930, the assigned value is stored in memory, and the initial PPI vector 830-$i$ is assigned an X (unassigned) value in the signal position occupied by the selected signal. Then, in block 940, the test generator 120 uses either forward implication techniques (forward time processing), or else invokes a fault simulator 135 to determine the effect of applying the reduced PPI vector, in conjunction with the initial sequence PI vectors 805-$i$, 805-($i+1$), 805-($i+2$) to the digital circuit 800.

Next, in block 950, the effect of the operation of block 940 is examined to determine whether the error signal still propagated from faulty node 884 to a PO 845-$x$, and was therefore still detectable. If the answer is yes, then processing continues at block 970 which checks to see whether all initial PPI vector signals have been processed by the reduce initial PPI assignments routine 900. If the test is affirmative, then processing continues at block 980, which returns to the justify initial PPI routine 550. If the test at block 970 is negative, then processing returns to block 910, where another signal is selected, and the same sequence of steps is begun.

Returning now to block 950, if it is determined that the error signal at faulty node 884 did not propagate to a PO 845-$x$, then processing continues at block 960, where the stored assigned signal value is retrieved and reassigned to the corresponding signal in the initial PPI vector 830-$i$. Processing then continues at block 970 which checks to see whether all initial PPI vector signals have been processed by the reduce initial PPI assignments routine 900. If the test is affirmative, then processing continues at block 980, which returns to the justify initial PPI routine 550. If the test at block 970 is negative, then processing returns to block 910, where another signal is selected, and the same sequence of steps is begun.

Figure 10:
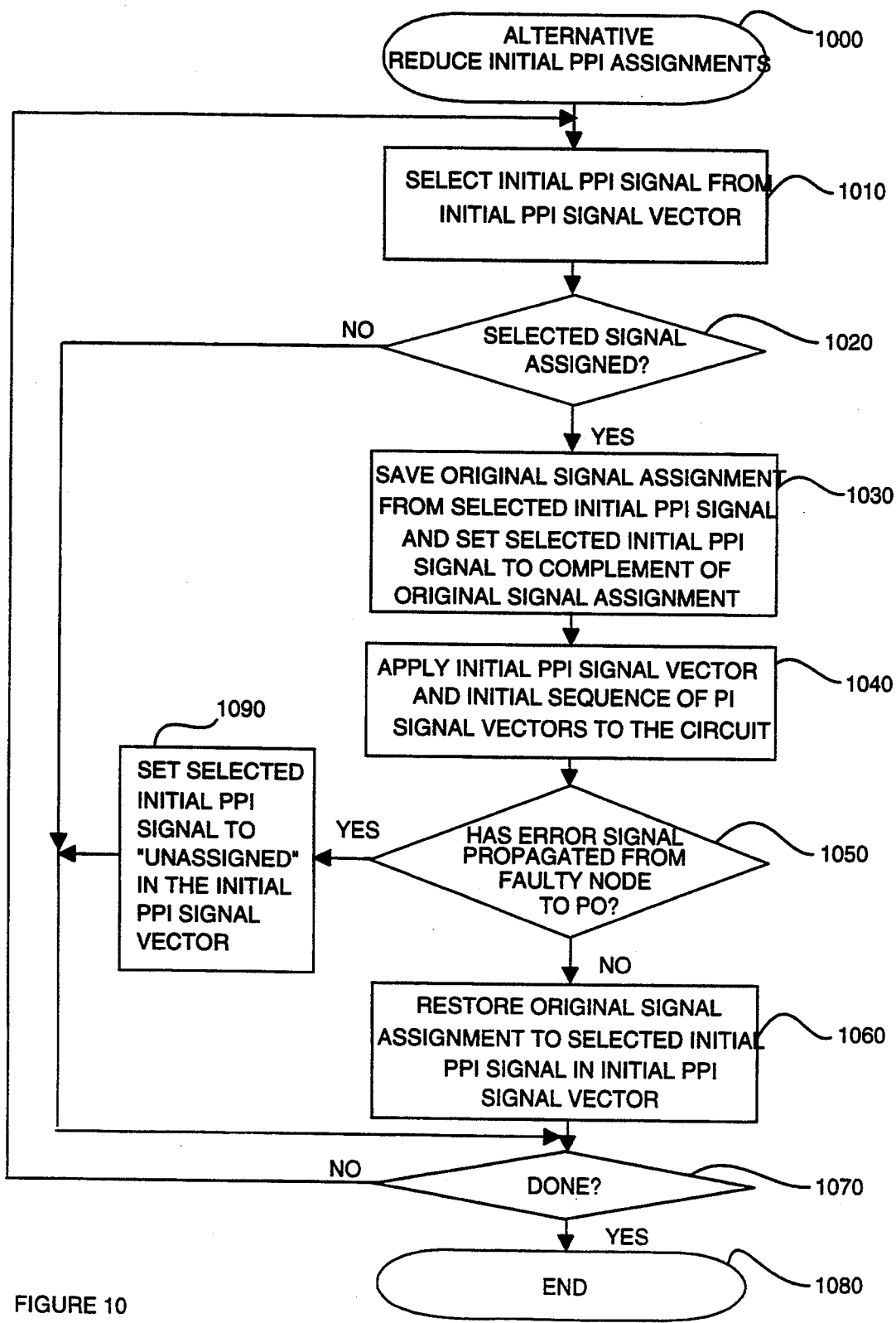
FIG. 10 is a flow chart of the Alternative Reduce Initial PPI Assignments routine of the present invention.

Referring now to FIG. 10, an alternative reduce initial PPI assignment routine 1000 is shown, which may be used in place of the reduce initial PPI assignment routine 900 just discussed. The alternative reduce initial PPI assignments routine 1000 begins at block 1010, where one of the signals that comprise the initial PPI vector 830-$i$ is selected. Next, in block 1020, the selected signal is tested to see whether a value was assigned to that signal during the target-D propagation routine 600. If the selected signal is unassigned (i.e., equal to X), then there is nothing more to do to it. Processing continues at block 1070, which checks to see whether all initial PPI vector signals have been processed by the alternative reduce initial PPI assignments routine 1000. If the test is affirmative, then processing continues at block 1080, which returns to the justify initial PPI routine 550. If the test at block 1070 is negative, then processing returns to block 1010, where another signal is selected, and the same sequence of steps is begun.

Returning back to block 1020, if the selected PPI signal has an assigned value, then processing continues at block 1030. In block 1030, the assigned value is stored in memory, and the signal position occupied by the selected signal in the initial PPI vector 830-$i$ is assigned a value that is the complement of the stored assigned value. Then, in block 1040, the test generator 120 uses either forward implication techniques (forward time processing), or else invokes a fault simulator 135 to determine the effect of applying the reduced PPI vector, in conjunction with the initial sequence PI vectors 805-$i$, 805-($i+1$), 805-($i+2$) to the digital circuit 800.

Next, in block 1050, the effect of the operation of block 1040 is examined to determine whether the error signal still propagated from faulty node 884 to a PO 845-$x$, and was therefore still detectable. If the answer is yes, then processing continues at block 1090, in which the signal position occupied by the selected signal in the initial PPI vector 830-$i$ is unassigned (set to X). Processing then continues at block 1070 which checks to see whether all initial PPI vector signals have been processed by the alternative reduce initial PPI assignments routine 1000. If the test is affirmative, then processing continues at block 1080, which returns to the justify initial PPI routine 550. If the test at block 1070 is negative, then processing returns to block 1010, where another signal is selected, and the same sequence of steps is begun.

Returning now to block 1050, if it is determined that the error signal at faulty node 884 did not propagate to a PO 845-$x$, then processing continues at block 1060, where the stored assigned signal value is retrieved and reassigned to the corresponding signal in the initial PPI vector 830-$i$. Processing then continues at block 1070 which checks to see whether all initial PPI vector signals have been processed by the alternative reduce initial PPI assignments routine 1000. If the test is affirmative, then processing continues at block 1080, which returns to the justify initial PPI routine 550. If the test at block 1070 is negative, then processing returns to block 1010, where another signal is selected, and the same sequence of steps is begun.

Returning again to the main test vector generator 500 in FIG. 5, after the step of justifying the initial PPI vector is performed, processing continues at block 560, where a test is performed to determine whether the justification process of block 550 was successful in producing the sequence of PI vectors 805-($i-4$), 805-($i-3$), 805-($i-2$), 805-($i-1$) that, when applied sequentially to the PI node 205 of the digital circuit 200 will produce a present state 225 equal to the initial PPI vector 830-$i$, regardless of the value of the known PPI vector 830-($i-4$). If PI vectors 805-($i-4$), 805-($i-3$), 805-($i-2$), 805-($i-1$) were not successfully generated, the processing continues at block 580, where this fault is marked as "abandoned," meaning that the main test vector generator was not able to produce a test sequence 130 for this particular fault. From block 580, execution continues at block 590, where the main test vector generator 500 determines whether there are any more faults for which it must attempt to generate test sequences 130. If there are more faults, then the entire loop is repeated, beginning at block 510. Otherwise, the routine ends at block 595.

If the justification process of block 550 was successful, then the test sequence 130 for detecting the stuck-at fault at the faulty node 884 is the sequence of PI vectors 805-($i-4$), 805-($i-3$), 805-($i-2$), 805-($i-1$) generated by the justification operation of block 550, followed by the sequence of PI vectors 805-$i$, 805-($i+1$), 805-($i+2$) that were generated by the targeted-D propagation routine 600. Processing at block 570, therefore, marks the stuck-at fault at faulty node 884 as "detected", and the generated test sequence comprising the PI vectors 805-($i-4$), 805-($i-3$), 805-($i-2$), 805-($i-1$), 805-$i$, 805-($i+1$), 805-($i+2$) is marked as the detecting sequence for the stuck-at fault at faulty node 884.

5. Reducing PI Assignments

Optionally, as part of the processing of block 570, the main test vector generator 500 executes the reduce PI assignments routine 1100, or the alternative reduce PI assignments routine 1200. These routines, which improve the generated test sequence 130 by increasing the number of unassigned signals in the PI vectors 805-$x$ will now be described in detail. They may be performed for both the fault-free and the faulty machines.

Figure 11:
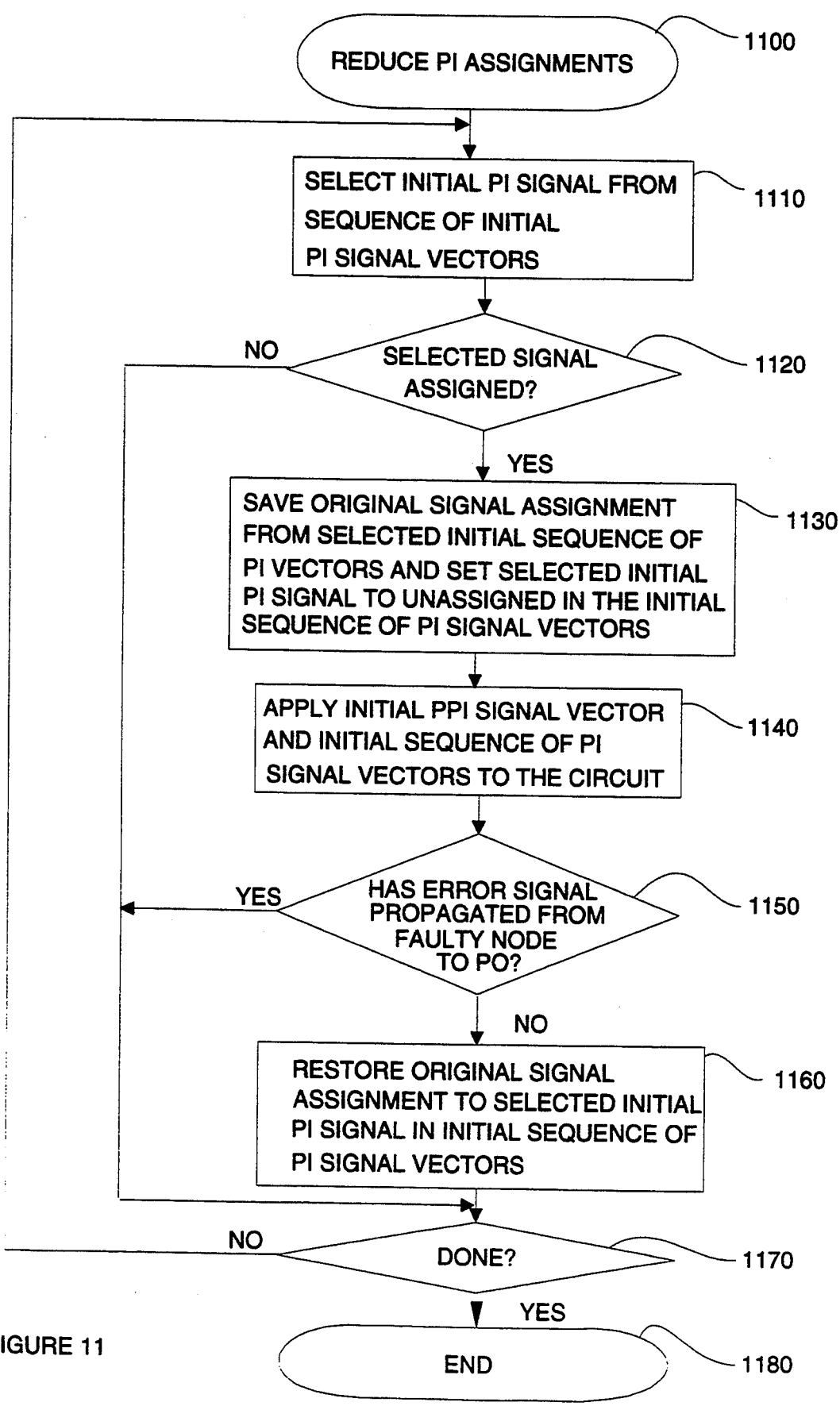
FIG. 11 is a flow chart of the Reduce PI Assignments routine of the present invention.

Referring now to FIG. 11, the reduce PI assignments routine 1100 begins at block 1110, where one of the signals that comprise the sequence of PI vectors 805-($i-4$) through 805-($i+2$) is selected. Next, in block 1120, the selected signal is tested to see whether a value was assigned to that signal during the target-D propagation routine 600 or by the justify initial PPI vector routine of block 550 in FIG. 5. If the selected signal is unassigned (i.e., equal to X), then there is nothing more to do to it. Processing continues at block 1170, which checks to see whether all PI vector signals have been processed by the reduce PI assignments routine 1100. If the test is affirmative, then processing continues at block 1180, which returns to the main test vector generator routine at block 590. If the test at block 1170 is negative, then processing returns to block 1110, where another signal is selected, and the same sequence of steps is begun.

Returning back to block 1120, if the selected PI signal has an assigned value, then processing continues at block 1130. In block 1130, the assigned value is stored in memory, and the initial PI vector 805-$n$ (where n is in the range $i-4$ to $i+2$ for our example) is assigned an X (unassigned) value in the signal position occupied by the selected signal. Then, in block 1140, the test generator 120 uses either forward implication techniques (forward time processing), or else invokes a fault simulator 135 to determine the effect of applying the sequence of reduced PI vectors, in conjunction with the known PPI vector 830-($i-4$), to the digital circuit 800.

Next, in block 1150, the effect of the operation of block 1140 is examined to determine whether the error signal still propagated from faulty node 884 to a PO 845-$x$, and was therefore still detectable. If the answer is yes, then processing continues at block 1170 which checks to see whether all PI vector signals have been processed by the reduce PI assignments routine 1100. If the test is affirmative, then processing continues at block 1180, which returns to the main test vector generator routine 500 at block 590. If the test at block 1170 is negative, then processing returns to block 1110, where another signal is selected, and the same sequence of steps is begun.

Returning now to block 1150, if it is determined that the error signal at faulty node 884 did not propagate to a PO 845-$x$, then processing continues at block 1160, where the stored assigned signal value is retrieved and reassigned to the corresponding signal in the sequence of PI vectors 805-$n$ (where n is in the range $i-4$ to $i+2$ for our example). Processing then continues at block 1170 which checks to see whether all PI vector signals have been processed by the reduce PI assignments routine 1100. If the test is affirmative, then processing continues at block 1180, which returns to the main test vector generator routine 500 at block 590. If the test at block 1170 is negative, then processing returns to block 1110, where another signal is selected, and the same sequence of steps is begun.

Figure 12:
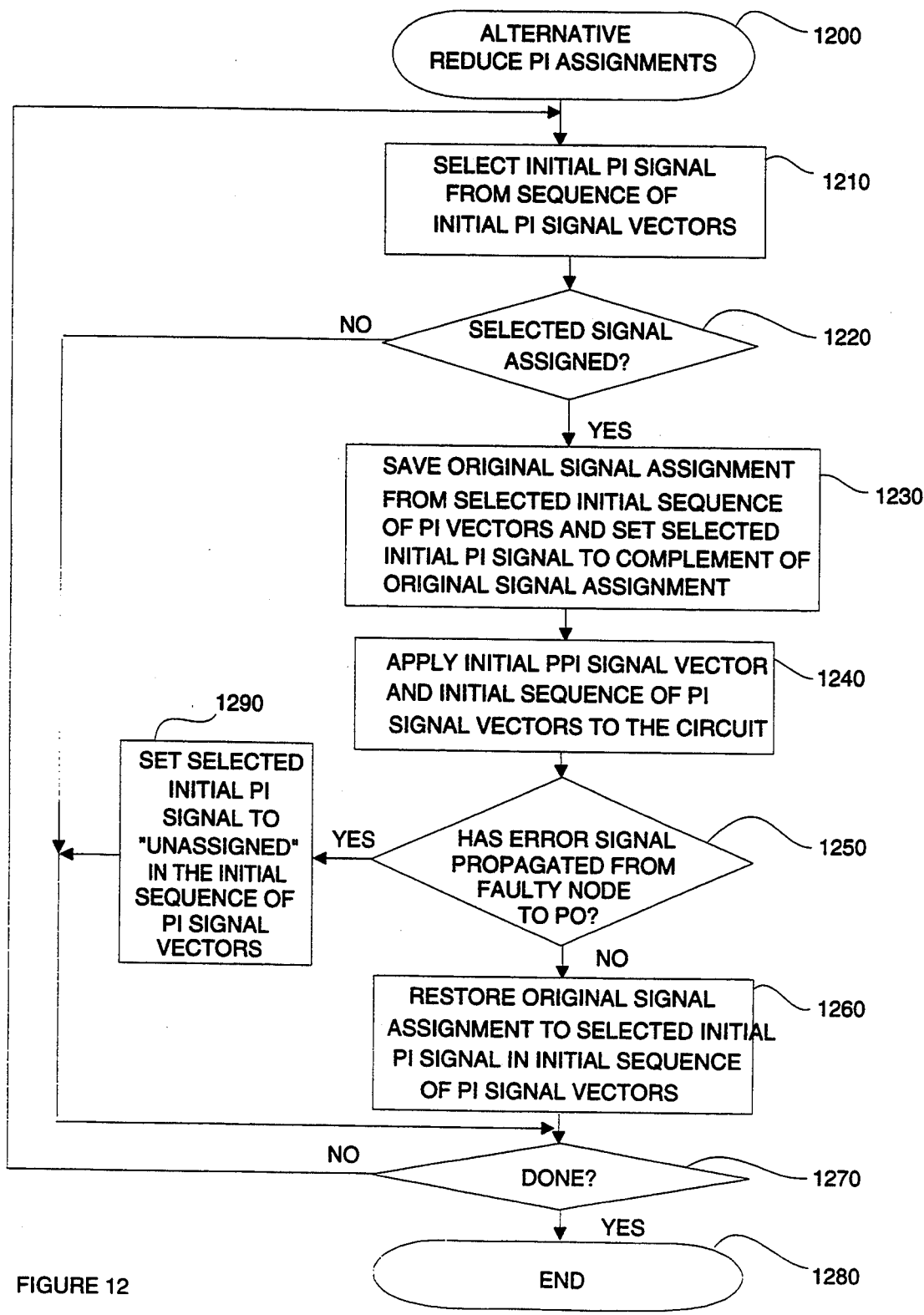
FIG. 12 is a flow chart of the Alternative Reduce PI Assignments routine of the present invention.

Referring now to FIG. 12, an alternative reduce PI assignments routine 1200 is shown, which may be used in place of the reduce PI assignment routine 1100 just discussed. The alternative reduce PI assignments routine 1200 begins at block 1210, where one of the signals that comprise the sequence of PI vectors 805-$n$ (where n is in the range $i-4$ through $i+2$ for our example) is selected. Next, in block 1220, the selected signal is tested to see whether a value was assigned to that signal during the target-D propagation routine 600 or by the justify initial PPI vector operation of block 550 in FIG. 5. If the selected signal is unassigned (i.e., equal to X), then there is nothing more to do to it. Processing continues at block 1270, which checks to see whether all PI vector signals have been processed by the alternative reduce PI assignments routine 1200. If the test is affirmative, then processing continues at block 1280, which returns to the main test vector generator routine 500 at block 590. If the test at block 1270 is negative, then processing returns to block 1210, where another signal is selected, and the same sequence of steps is begun.

Returning back to block 1220, if the selected PI signal has an assigned value, then processing continues at block 1230. In block 1230, the assigned value is stored in memory, and the signal position occupied by the selected signal in the sequence of PI vectors 805-$n$ (where n is in the range $i-4$ through $i+2$ for our example) is assigned a value that is the complement of the stored assigned value. Then, in block 1240, the test generator 120 uses either forward implication techniques (forward time processing), or else invokes a fault simulator 135 to determine the effect of applying the sequence of PI vectors, including the reduced PI vector, in conjunction with the initial PPI vector 830-1 to the digital circuit 800.

Next, in block 1250, the effect of the operation of block 1240 is examined to determine whether the error signal still propagated from faulty node 884 to a PO 845-$x$, and was therefore still detectable. If the answer is yes, then processing continues at block 1290, in which the signal position occupied by the selected signal in the sequence of PI vectors 805-n (where n is in the range i−4 through i+2 for our example) is unassigned (set to X). Processing then continues at block 1270 which checks to see whether all PI vector signals have been processed by the alternative reduce PI assignments routine 1200. If the test is affirmative, then processing continues at block 1280, which returns to the main test vector generator 500 at block 590. If the test at block 1270 is negative, then processing returns to block 1210, where another signal is selected, and the same sequence of steps is begun.

Returning now to block 1250, if it is determined that the error signal at faulty node 884 did not propagate to a PO 845-x, then processing continues at block 1260, where the stored assigned signal value is retrieved and reassigned to the corresponding signal in the sequence of PI vectors 805-n (where n is in the range i−4 through i+2 for out example). Processing then continues at block 1270 which checks to see whether all PI vector signals have been processed by the alternative reduce PI assignments routine 1200. If the test is affirmative, then processing continues at block 1280, which returns to the main test vector generator 500 routine at block 590. If the test at block 1270 is negative, then processing returns to block 1210, where another signal is selected, and the same sequence of steps is begun.

Returning again to the main test vector generator 500 in FIG. 5, at block 590 the main test vector generator 500 determines whether there are any more faults for which it must attempt to generate test sequences 130. If there are more faults, then the entire loop is repeated, beginning at block 510. Otherwise, the routine ends at block 595.

6. Increased Fault Detection

When the main test vector generator 500 has been run, there may be faults that were abandoned due to extremely long computation time. To attempt to successfully generate test vectors for these abandoned faults, a phase II test vector generator routine 1300 may be used. This routine, which requires that an extra step be performed in the main test vector generator 500, will now be described.

Figure 13:
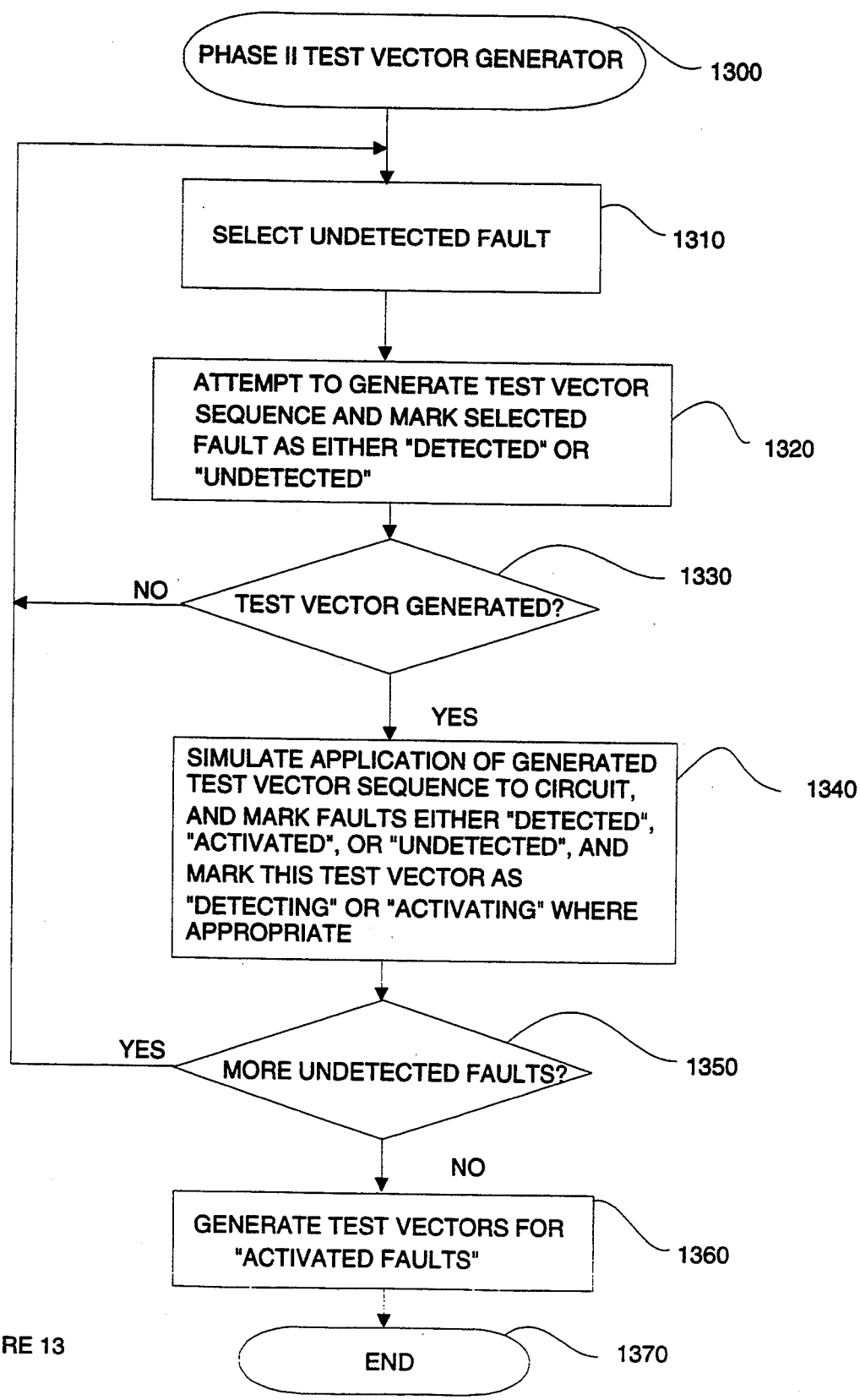
FIG. 13 is a flow chart of the overall operation of the Phase II Test Vector Generator of the present invention.

Referring to FIG. 13, a flow chart of the phase II test vector generator 1300 is shown. The routine begins processing at block 1310, where a stuck-at fault at a faulty node 1684 is selected for which no attempt has yet been made to generate a test sequence 130. Next, in block 1320, the phase II test vector generator 1300 uses the various strategies previously described with respect to the main test vector generator 500 to try to generate test sequences for detectable faults. In other words, the phase II test vector generator 1300 begins by activating the fault, using the targeted-D propagation routine 600 to attempt to propagate the fault to a PO.

Next, at block 1330, a test is performed to determine whether a test sequence 130 was successfully generated for the selected fault. If no test sequence 130 was generated, then processing returns to block 1310 to try to generate a test sequence 130 for a different fault.

If the processing in block 1330 determines that a test sequence 130 was generated for the selected fault, then the phase II test vector generator 1300 invokes the fault simulator 135 to have the behavior of the digital circuit in response to the generated test sequence 130 analyzed. Of course, the test sequence 130 should activate a signal at the faulty node and cause that signal to propagate to a PO in the digital circuit. In addition, however, the test sequence may also activate error signals at other nodes that are propagated to a PO by the test sequence 130. The fault simulator must report the identities of these other nodes to the phase II test vector generator, which in block 1340 marks those faults as being detected, and recording which test sequence 130 was the detecting test sequence.

Additionally, the fault simulator may detect nodes at which error signals were activated, and propagated to a PPO, but not a PO in the circuit. This situation is shown in the ILA model of sequential digital circuit 1600 of FIG. 16, where the fault simulator 135 is able to detect that the previously generated sequence of PI vectors 1605-1, 1605-2, 1605-3 cause an error signal to propagate from the faulty node 1684 to PPO3 1630-3. The fault simulator must report the identities of these nodes, (in this example, faulty node 1684) to the phase II test vector generator, which in block 1340 marks those faults as being activated and propagated to a PPO (but not to a PO), and records which test sequence 130 was the activating test sequence. Execution continues at block 1350, where the phase II test vector generator 1300 determines whether there are any more faulty nodes for which no attempt has been made to generate a test sequence 130. If there are more of such nodes, processing branches back to block 1310, where the steps just described are repeated.

If the determination made in block 1350 shows that an attempt has been made to generate a test sequence for every fault site in the digital circuit 1600, then processing continues at block 1360. Block 1360 broadly states the step of generating test vectors for those nodes that were marked as being activated in block 1340. This operation is shown in more detail in the flow chart of FIG. 14.

Figure 14:
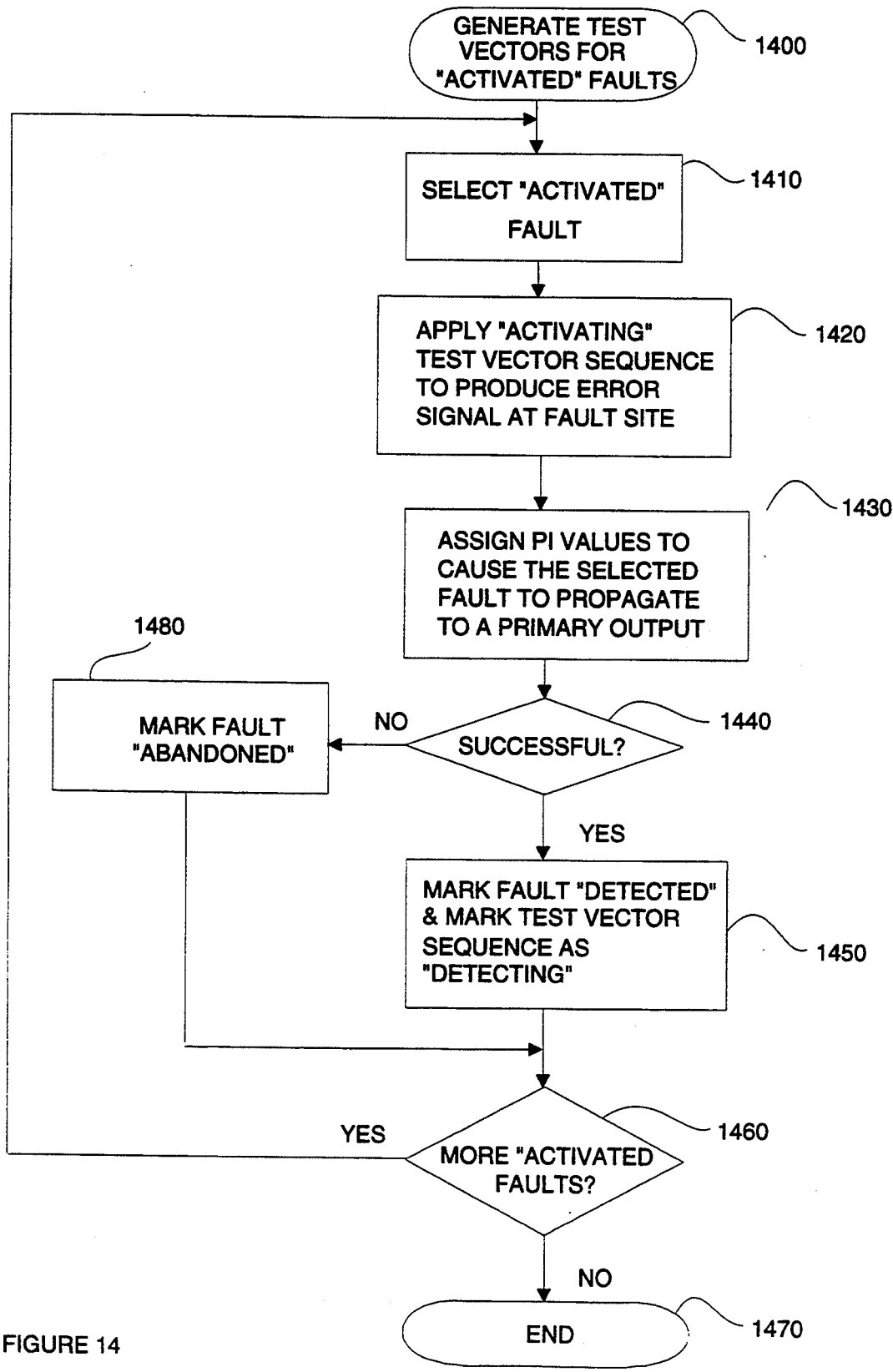
FIG. 14 is a flow chart of the Generate Test Vectors For Activated Faults routine of the present invention.

Referring now to FIG. 14, at block 1410 one of the fault sites from those designated as "activated" in block 1340 is selected. In the example in FIG. 16, this is faulty node 1684.

Figure 16:
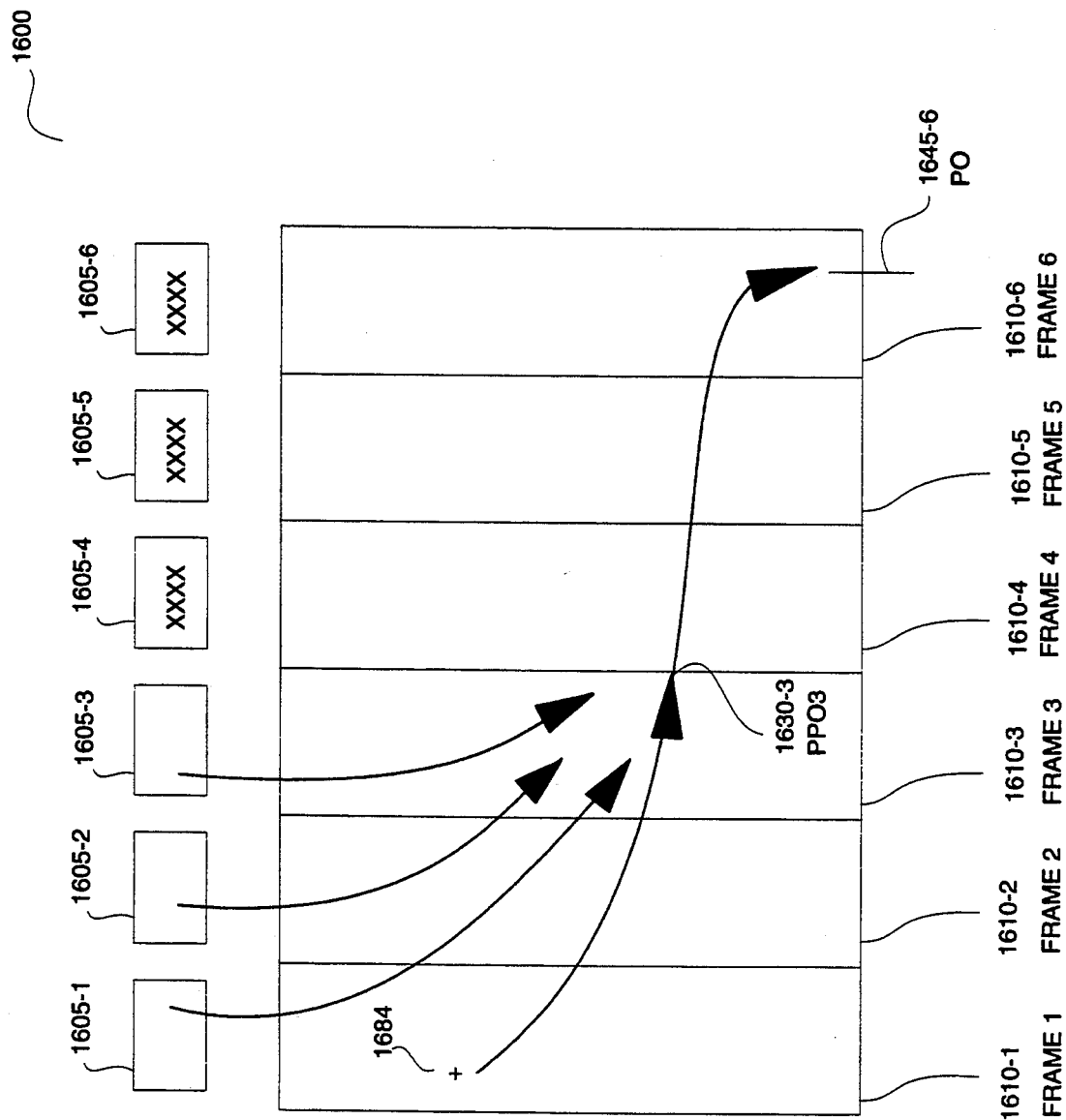
FIG. 16 is an illustration of an ILA model of a digital circuit in which the Phase II test Vector Generator of the present invention is operating.

Next, in block 1420, the application of the activating sequence of PI vectors to the digital circuit 1600 is emulated, causing an error signal to propagate to a PPO node. In the example of FIG. 16, the activating sequence comprises the PI vectors 1605-1, 1605-2, 1605-3, and the error signal propagates from faulty node 1684 to PPO3 1630-3.

Next, in block 1430, forward time processing techniques are utilized to assign values to as yet unassigned PI signals, in an attempt to cause the error signal to propagate to a PO. In the preferred embodiment, the targeted-D propagation routine 600 is utilized. Note that no assignments will be made to any PPI vectors in this step. This is because when the targeted-D propagation routine 600 is first invoked, starting with time frame four 1610-5, the PPI vector at PPO3 1630-3 is already completely defined by the processing that occurred in the previous time frames. Processing then continues at block 1440.

In block 1440, a test is performed to determine whether the processing in block 1430 generated a test sequence of PI vectors 1605-4, 1605-5, 1605-6 that caused the error signal at PPO3 1630-3 to propagate to a PO 1645-6. If no such sequence was generated, processing continues at block 1480, where the faulty node 1684 is marked abandoned. Processing then proceeds to block 1460, where a test is made to determine whether any more faults exist for which no attempt has yet been made to generate a test sequence 130. If the answer is no, the generate test vectors for activated faults routine 1400 terminates at block 1470. Otherwise, processing branches back to block 1410 to repeat the loop just described for another activated fault.

If, however, the targeted-D propagation routine executed in block 1430 was successful in generating a test sequence of PI vectors 1605-4, 1605-5, 1605-6 that caused the error signal at PPO3 1630-3 to propagate to a PO 1645-6, then the faulty node 1684 is marked as detected, and the sequence of PI vectors 1605-1, 1605-2, 1605-3, 1605-4, 1605-5, 1605-6 is recorded as the detecting test sequence 130. Processing then continues at block 1460, where a test is made to determine whether any more faults exist for which no attempt has yet been made to generate a test sequence 130. If the answer is no, the generate test vectors for activated faults routine 1400 terminates at block 1470. Otherwise, processing branches back to block 1410 to repeat the loop just described for another activated fault.

Figure 15:
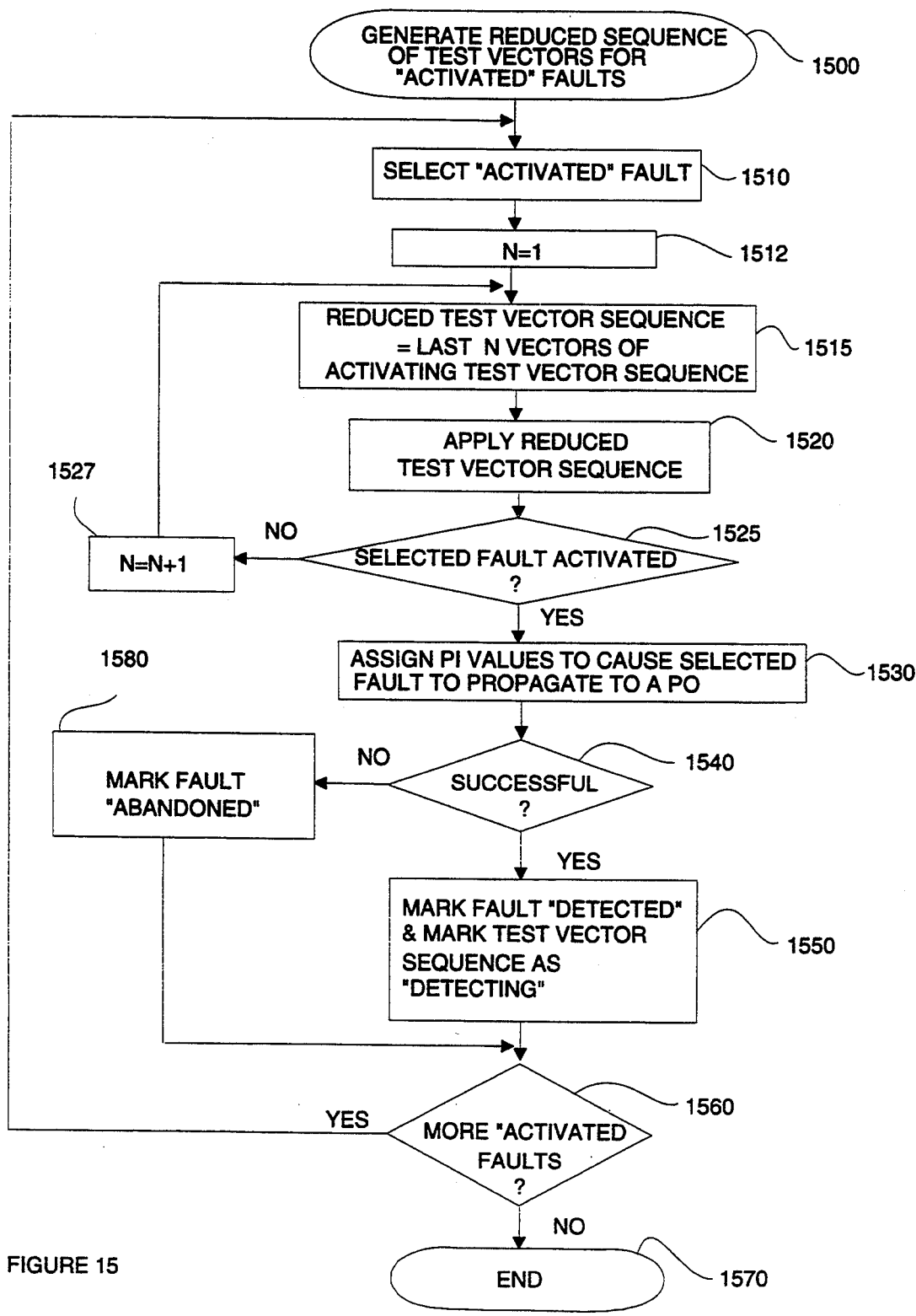
FIG. 15 is a flow chart of the Generate Reduced Sequence of Test Vectors For Activated Faults routine of the present invention.

A modified version of the generate test vectors for activated faults routine is shown in FIG. 15. The generate reduced sequence of test vectors for activated faults routine 1500 also generates test vectors for those nodes that were marked as being activated in block 1340 of FIG. 13, but has the added feature of producing test sequences containing fewer PI vectors to be applied in order to test a particular faulty node. The generate reduced sequence of test vectors for activated faults routine 1500 will now be described in detail.

Referring now to FIG. 15, at block 1510 one of the fault sites from those designated as "activated" in block 1340 is selected. In the example in FIG. 16, this is faulty node 1684. Assume, for this example, that block 1340 in FIG. 13 designated the activating sequence to be the PI vectors V8 1705-1 through V12 1705-5 shown in FIG. 17a. Here it is known that application of this test vector sequence will cause an error signal located at faulty node 1784 to propagate to PPO5 1730-5.

Next, in block 1512, a loop variable N is initialized to a value of 1, and in block 1515 a reduced test vector sequence is set equal to the last N vectors in the activating test vector sequence 1705-1, ..., 1705-5. In our example, the reduced test vector sequence would be set equal to the single PI vector V12 1705-5, shown in FIG. 17b.

Figures 17A, 17B, 17C, 17D, 17E:
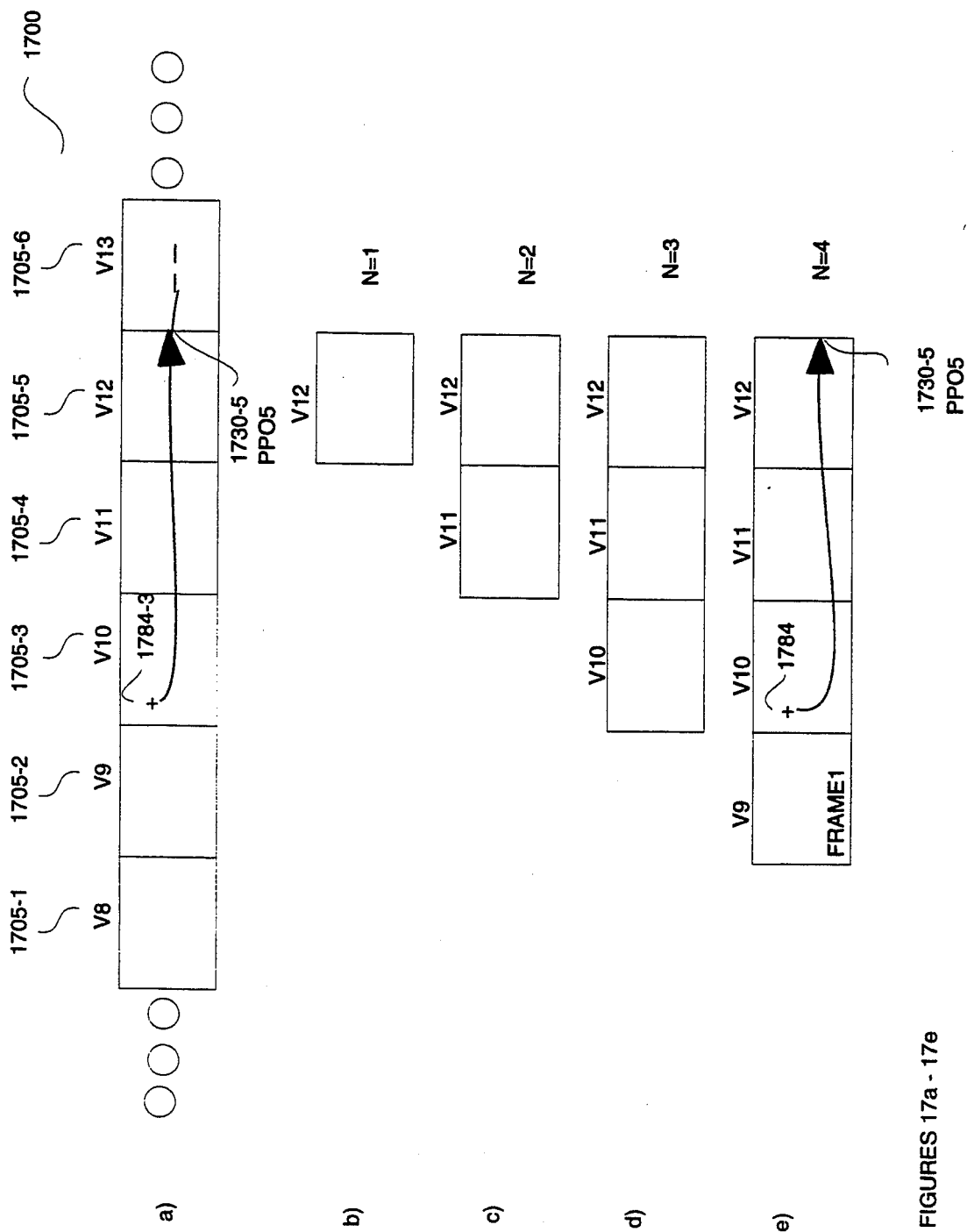
FIGS. 17a–17f are illustrations of the operation of the Generate Reduced Sequence of Test Vectors routine of the present invention upon an ILA model of a digital circuit.

Next, in block 1520, the application of the reduced test vector sequence of PI vectors to the digital circuit 1600 is emulated, and in block 1527 a determination is made whether this caused an error signal to propagate from the faulty node 1784 to a PPO node. In the example of FIG. 17b, the reduced test vector sequence of PI vectors comprising the vector V12 1705-5 does not cause an error to propagate to a PPO. Consequently, processing continues at block 1527, where the loop variable N is incremented by 1. The loop comprising blocks 1515, 1520, 1525, 1527 is repeated as the reduced test vector sequence of PI vectors comprising first V11 1705-4 through V12 1705-5 (FIG. 17c), and V10 1705-3 through V12 1705-5 (FIG. 17d) are applied to the digital circuit 1700 without success. Then, when the reduced test vector sequence of PI vectors comprising V9 1705-2 through V12 1705-5 (FIG. 17e) is applied to the digital circuit 1700, the routine determines that an error signal has propagated from the faulty node 1784 to the PPO5 1730-5. Leaving this reduced test vector sequence of PI vectors applied to the digital circuit 1700, processing continues at block 1530.

Figure 17F:
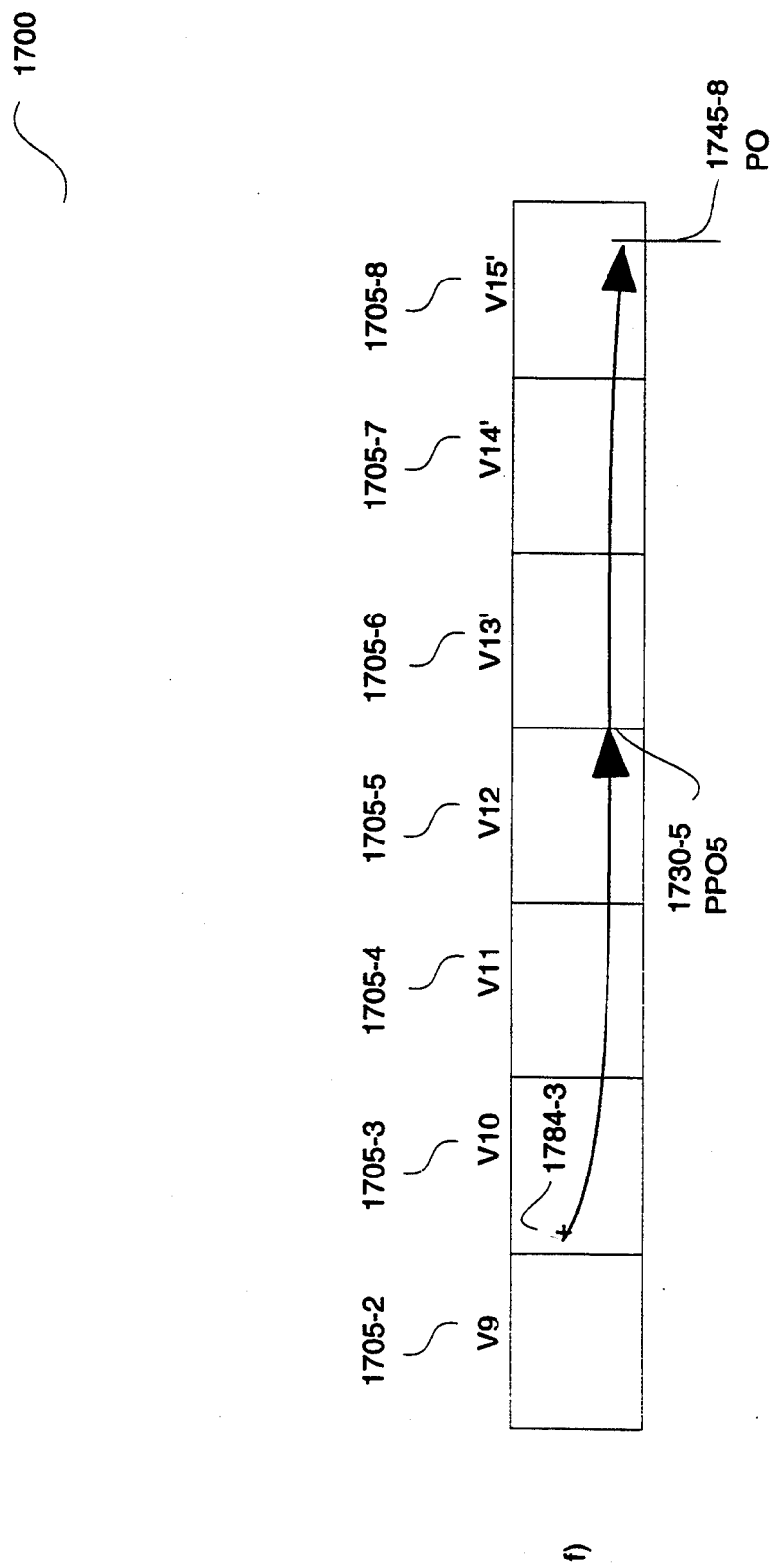

In block 1530, forward time processing techniques are utilized to assign values to as yet unassigned PI signals, in an attempt to cause the error signal to propagate to a PO. In the preferred embodiment, the targeted-D propagation routine 600 is utilized. Note that no assignments will be made to any PPI vectors in this step. This is because when the targeted-D propagation routine 600 is first invoked, starting with time frame five 1710-5 in FIG. 17f, the PPI vector at PPO5 1730-5 is already completely defined by the processing that occurred in the previous time frames. Processing then continues at block 1540.

In block 1540, a test is performed to determine whether the processing in block 1530 generated a test sequence of PI vectors V13' 1705-6, V14' 1705-7, V15' 1705-8 that caused the error signal at PPO5 1730-5 to propagate to a PO 1745-8. If no such sequence was generated, processing continues at block 1580, where the faulty node 1784 is marked abandoned. Processing then proceeds to block 1560, where a test is made to determine whether any more faults exist for which no attempt has yet been made to generate a test sequence 130. If the answer is no, the generate reduced sequence of test vectors for activated faults routine 1500 terminates at block 1570. Otherwise, processing branches back to block 1510 to repeat the loop just described for another activated fault.

If, however, the targeted-D propagation routine executed in block 1530 was successful in generating a test sequence of PI vectors V13' 1705-6 through V15' 1705-8 that caused the error signal at PPO5 1730-5 to propagate to a PO 1745-8, then the faulty node 1784 is marked as detected, and the sequence of PI vectors V9 1705-2, V10 1705-3, V11 1705-4, V12 1705-5, V13' 1705-6, V14' 1705-7, V15' 1705-8 is recorded as the detecting test sequence 130. Processing then continues at block 1560, where a test is made to determine whether any more faults exist for which no attempt has yet been made to generate a test sequence 130. If the answer is no, the generate reduced sequence of test vectors for activated faults routine 1500 terminates at block 1570. Otherwise, processing branches back to block 1510 to repeat the loop just described for another activated fault.

7. Test Sequence Generation From Known Present State

The justification techniques described above in section 3 solve the problem of test PI vector generation for sequential digital circuits that start out in an unknown state. However, the state justification process can be enhanced if one proceeds forwards from a known PPI vector and tries to make PI vector assignments to produce the initial PPI vector generated in the targeted-D propagation routine described above.

Figure 18:
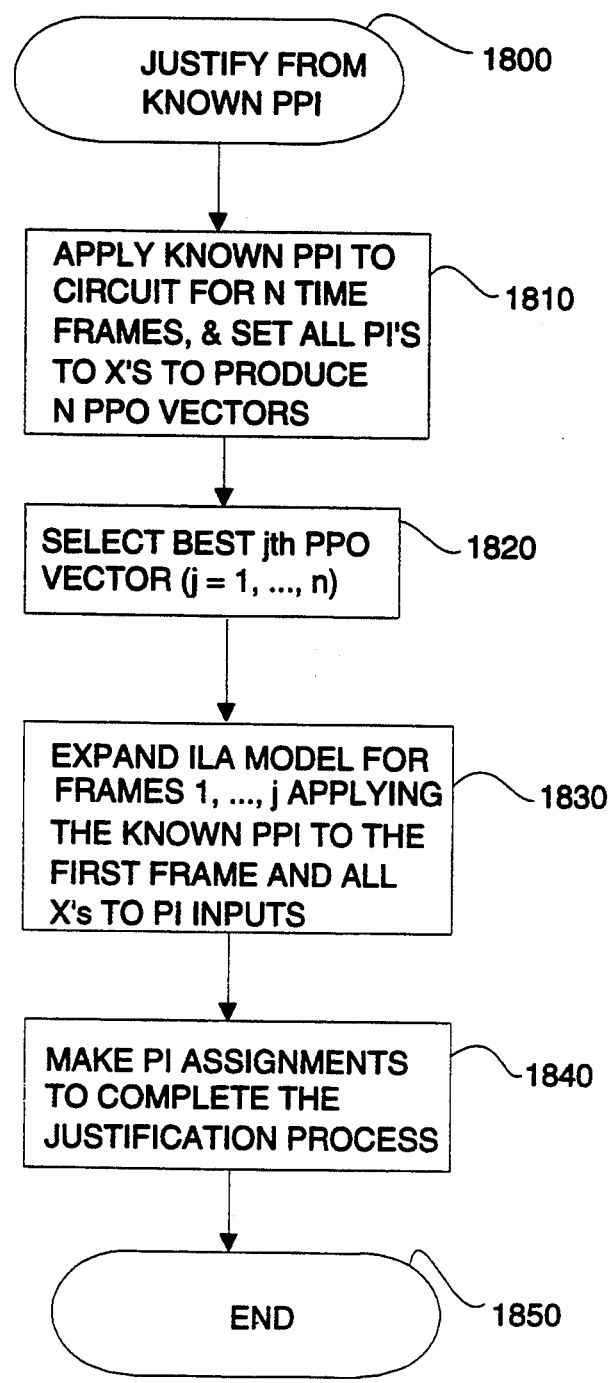
FIG. 18 is a flow chart of the Justify From Known PPI routine of the present invention.

Referring now to FIG. 18, a flow chart that uses this approach to state justification is shown. This will be described in conjunction with the example shown in FIG. 19.

Processing starts at block 1810 where an ILA expansion of n time frames is made of the digital circuit 1900. In the example shown in FIG. 19, n was chosen to be 4 time frames 1910-1, ..., 1910-4. The PI vectors 1905-1, ..., 1905-4 for these time frames 1910-1, ..., 1910-4 are set to X (unassigned) values, the known PPI vector 1930-0 is applied to the first time frame 1910-1, and the digital circuit's operation is emulated to determine the four PPO vectors 1930-1, ..., 1930-4 that would be produced under these conditions.

Next, in block 1820, a best time frame is selected that most closely equals the desired initial PPI state without having any conflicting signal assignments. For example, if the desired initial state is the vector 1100, and PPO1=X0XX, PPO2=X1XX, PPO3=X10X, and PPO4=0100, then the best time frame is time frame 3 1910-3. This is because PPO3 1930-3 has two values (1 and 0 in the second and third position of the vector) that match corresponding values in the initial PPI vector 1930-i. This is more than the number of matching values found in PPO1 1930-1 and PPO2 1930-2. PPO3 1930-3 is also better than PPO4 1930-4, despite the fact that PPO4 1930-4 has three matching values (i.e., the 1, 0, and 0 that appear in the second, third, and fourth positions of the vector), because the first value in PPO4 1930-4, namely a 0, conflicts with the desired first value found in the initial PPI vector 1930-i (i.e., 1). Having selected a best time frame, processing continues at block 1830.

At block 1830, the ILA model is used to expand the digital circuit 1900 for the number of time frames corresponding to the best time frame 1905-j. In our example from above, an ILA expansion of 3 time frames would be made, using the known PPI 1930-0 as the input to frame 1, and ending with the best PPO 1930-3 selected above. The PI vectors 1905-1, ..., 1905-3 are left unassigned (X). This produces the best PPO-3 that was selected in step 1820 above.

Next, in block 1840 the justification techniques as described in section 3 above are utilized to make the necessary assignments to the PI vectors 1905-1, ..., 1905-j that will produce in the digital circuit 1900 a PPO that exactly matches the initial PPI 1930-i. This job is made easier by the fact that some of the target signals in the initial PPI 1905-i were found, in the steps above, to be completely determined by the known PPI 1930, making assignments to PI vectors unnecessary for these signals.

8. Results

The results of the various techniques used in the present test generation system 100 are described in the attached Appendices A and B.

While the invention has been described with respect to preferred embodiments thereof, it is to be understood that the foregoing and other modifications and variations may be made without departing from the scope and spirit thereof.

What is claimed is:

1. In a digital circuit testing system including a memory for storing therein digital circuit data that is representative of a digital circuit which includes gates having input nodes and output nodes; the digital circuit testing system including a central processing unit (CPU) coupled to the memory for storing and retrieving the digital circuit data therein, the CPU also emulating an application of signals to nodes in the digital circuit, and emulating logic operations of the gates in the digital circuit and output signals thereof in response to emulated input signals applied thereto, and storing results of the emulation within the memory, a method of generating a test sequence of primary input (PI) signal vectors for detecting a stuck-at fault having a stuck-at value at a faulty node that propagates as an error signal in the digital circuit, the method comprising the steps of:
   a) assigning signal values to a first set of nodes including initial primary input (PI) nodes and initial pseudo-primary input (PPI) nodes that cooperate in the digital circuit to generate a good signal having a value that is a complement of the stuck-at value at the faulty node;
   b) determining a set of gates in the digital circuit having an error signal on a gate input node attributable to the stuck-at value and also having an undetermined (X) value on an output node;
   c) selecting a next gate from the set of gates, and storing in the memory indications of unselected gates remaining in the set;
   d) for each dominator gate of the next gate, assigning propagating signal values to a set of dominator input nodes that cooperate in the digital circuit to cause the error signal to propagate to an output node of each dominator gate;
   e) for every assigned propagating signal value, assigning to as yet unassigned initial PI and initial PPI nodes initial PI and initial PPI signal values that cooperate in the digital circuit to generate the assigned propagating signal values at the dominator input nodes;
   f) emulating the propagation of the error signal through each dominator gate and all other gates in the circuit that are conditioned by the assigned initial PI and initial PPI signal values to propagate the error signal to a set of successor input nodes of a set of successor gates; and
   g) repeating steps c) through f), using the successor gates in place of the next gates and using the successor input nodes in place of the gate input nodes, until the error signal has arrived at a primary output (PO); and
   h) processing at the CPU to produce from the initial PI and initial PPI signal values a known PPI signal vector and the test sequence of PI signal vectors.

2. A method according to claim 1 further comprising the steps of:
   e) after step g), determining whether signal assignments can be made to as yet unassigned initial PI and initial PPI nodes that generates the assigned propagating signal values at the dominator input nodes, and if not, then unassigning all initial PI and initial PPI signal values assigned during step e), and retrieving from the memory the indications of the unselected gates and selecting a next gate therefrom, and continuing at step d); and wherein step h) comprises the steps of
   j) determining whether steps b) through i) succeeded in propagating the error signal to the PO, and if so, then processing at the CPU to produce from the initial PI and initial PPI signal values a known PPI signal vector and the test sequence of PI signal vectors.

3. A method according to claim 2 wherein in step j), the substep of processing at the CPU to produce from the initial PI and initial PPI signal values a known PPI signal vector and the test sequence of PI signal vectors comprises the steps of:
   k) selecting a known PPI signal vector having all of its signals unassigned; and
   l) processing according to a reverse time processing technique to produce the test sequence of PI signal vectors.

4. A method according to claim 2 wherein in step j), a substep of processing at the CPU to produce from the initial PI and initial PPI signal values a known PPI signal vector and the test sequence of PI signal vectors, comprises the steps of:
   k) selecting a known PPI signal vector;

l) setting a trial sequence of PI signal vectors to an unassigned (X) state;

m) emulating the application of the known PPI signal vector and the trial sequence of PI signal vectors to a model digital circuit representing an n time frame iterative logic array (ILA) expansion of the digital circuit to be tested, where n is an integer greater than or equal to one, to produce n model PPI signal vectors, each model PPI signal vector comprising a set of signals which may or may not have an assigned signal value;

n) selecting a best PPI signal vector from the n model PPI signal vectors, that satisfies the conditions that it does not have fewer signal values assigned to corresponding assigned initial PPI signal values than any other PPI signal vector, and all of its assigned signal values are either equal to corresponding signal values in the initial PPI signal values or else correspond to unassigned signal values in the initial PPI signal values; and o) assigning values to a test sequence of unassigned PI signal values to produce a test sequence of PI signal vectors spanning a first time frame at which the known PPI signal vector is present to a last time frame at which the best PPI signal vector is active, wherein the assigned PI signal values cooperate with the known PPI signal vector to generate remaining signal values in the initial PPI signal values.

5. In a digital circuit testing system including a memory for storing therein digital circuit data that is representative of a digital circuit which includes gates having input nodes and output nodes; the digital circuit testing system including a central processing unit (CPU) coupled to the memory for storing and retrieving the digital circuit data therein, the CPU also emulating an application of signals to nodes in the digital circuit, and emulating logic operations of the gates in the digital circuit and output signals thereof in response to emulated input signals applied thereto, and storing results of the emulation within the memory, wherein the digital circuit testing system generates a test sequence of primary input (PI) signal vectors and a known pseudo-primary input (PPI) signal vector for detecting a stuck-at fault at a faulty node in the digital circuit having a stuck-at value, the test sequence of PI signal vectors and the known PPI signal vector cooperating when applied to the digital circuit to cause an error signal at the faulty node to propagate to a primary output (PO) of the digital circuit, the digital circuit testing system generating the test sequence by producing an initial sequence of PI signal vectors and an initial PPI signal vector from which the known PPI signal vector and the test sequence of PI signal vectors are generated, the initial sequence of PI signal vectors and the initial PPI signal vector cooperating when applied to the digital circuit to cause the error signal at the faulty node in the digital circuit to propagate to the PO of the digital circuit, a method of producing a reduced initial PPI signal vector that has fewer assigned PPI signals than the initial PPI signal vector and that cooperates with the initial sequence of PI signal vectors when applied to the digital circuit to propagate the error signal from the faulty node to the PO, the method comprising the steps of:

a) selecting an initial PPI signal that has an assigned signal value from the initial PPI signal vector;

b) storing the assigned signal value in the memory and setting the selected initial PPI signal to an unassigned value to produce a reduced initial PPI input signal vector;

c) applying the reduced initial PPI signal vector and the initial sequence of PI signal vectors to the digital circuit; and d) if the error signal does not propagate from the faulty node to the PO, retrieving the stored assigned signal value from the memory, and assigning the stored assigned signal value to the selected initial PPI signal in the reduced initial PPI signal vector.

6. In a digital circuit testing system including a memory for storing therein digital circuit data that is representative of a digital circuit which includes gates having input nodes and output nodes; the digital circuit testing system including a central processing unit (CPU) coupled to the memory for storing and retrieving the digital circuit data therein, the CPU also emulating an application of signals to nodes in the digital circuit, and emulating logic operations of the gates in the digital circuit and output signals thereof in response to emulated input signals applied thereto, and storing results of the emulation within the memory, wherein the digital circuit testing system generates a test sequence of primary input (PI) signal vectors and a known pseudo-primary input (PPI) signal vector for detecting a stuck-at fault at a faulty node in the digital circuit, the stuck-at fault having a stuck-at value, the test sequence of PI signal vectors and the known PPI signal vector cooperating when applied to the digital circuit to cause an error signal at the faulty node to propagate to a primary output (PO) of the digital circuit, the digital circuit testing system generating the test sequence by producing an initial sequence of PI signal vectors and an initial PPI signal vector from which the known PPI signal vector and the test sequence of PI signal vectors are generated, the initial sequence of PI signal vectors and the initial PPI signal vector cooperating when applied to the digital circuit to cause the error signal at the faulty node in the digital circuit to propagate to the PO of the digital circuit, a method of producing a sequence of reduced PI signal vectors that has fewer assigned PI signals than the first sequence of PI signal vectors and that cooperates with the known PPI signal vector when applied to the digital circuit to propagate the error signal from the faulty node to the PO, the method comprising the steps of:

a) selecting a test PI signal that has an assigned value from the test sequence of PI signal vectors;

b) storing the assigned signal value in the memory and setting the selected test PI signal to an unassigned value to produce a sequence of reduced PI signal vectors;

c) applying the sequence of reduced PI input signal vectors and the known PPI signal vector to the digital circuit; and d) if the error signal does not propagate from the faulty node to the primary output, retrieving the stored assigned signal value from the memory, and assigning the stored assigned signal value to the selected test PI signal in the sequence of reduced PI signal vectors.

7. In a digital circuit testing system including a memory for storing therein digital circuit data that is representative of a digital circuit which includes gates having input nodes and output nodes; the digital circuit testing system including a central processing unit (CPU) coupled to the memory for storing and retrieving the digital circuit data therein, the CPU also emulating an application of signals to nodes in the digital circuit, and emulating logic operations of the gates in the digital circuit and output signals thereof in response to emulated input signals applied thereto, and storing results of the emulation within the memory, wherein the digital circuit testing system generates a test sequence of primary input (PI) signal vectors and a known pseudo-primary input (PPI) signal vector for detecting a stuck-at fault at a faulty node in the digital circuit having a stuck-at value, the test sequence of PI signal vectors and the known PPI signal vector cooperating when applied to the digital circuit to cause an error signal at the faulty node to propagate to a primary output (PO) of the digital circuit, the digital circuit testing system generating the test sequence by producing an initial sequence of PI signal vectors and an initial PPI signal vector from which the known PPI signal vector and the test sequence of PI signal vectors are generated, the initial sequence of PI signal vectors and the initial PPI signal vector cooperating when applied to the digital circuit to cause the error signal at the faulty node in the digital circuit to propagate to the PO of the digital circuit, a method of producing a reduced initial PPI signal vector that has fewer assigned PPI signals than the initial PPI signal vector and that cooperates with the initial sequence of PI signal vectors when applied to the digital circuit to propagate the error signal from the faulty node to the PO, the method comprising the steps of:

a) selecting an initial PPI signal that has an assigned signal value from the initial PPI signal vector;

b) storing the assigned signal value in the memory and setting the selected initial PPI signal to the complement of the stored assigned signal value to produce a modified initial PPI input signal vector;

c) applying the modified initial PPI signal vector and the initial sequence of PI signal vectors to the digital circuit; and d) if the error signal does not propagate from the faulty node to the primary output, retrieving the stored assigned signal value from the memory, and assigning the stored assigned signal value to the selected initial PPI signal in a reduced initial PPI signal vector, otherwise setting the selected initial PPI signal to an unassigned value in the reduced initial PPI signal vector.

8. In a digital circuit testing system including a memory for storing therein digital circuit data that is representative of a digital circuit which includes gates having input nodes and output nodes; the digital circuit testing system including a central processing unit (CPU) coupled to the memory for storing and retrieving the digital circuit data therein, the CPU also emulating an application of signals to nodes in the digital circuit, and emulating logic operations of the gates in the digital circuit and output signals thereof in response to emulated input signals applied thereto, and storing results of the emulation within the memory, wherein the digital circuit testing system generates a test sequence of primary input (PI) signal vectors and a known pseudo-primary input (PPI) signal vector for detecting a stuck-at fault at a faulty node in the digital circuit, the stuck-at fault having a stuck-at value, the test sequence of PI signal vectors and the known PPI signal vector cooperating when applied to the digital circuit to cause an error signal at the faulty node to propagate to a primary output (PO) of the digital circuit, the digital circuit testing system generating the test sequence by producing an initial sequence of PI signal vectors and an initial PPI signal vector from which the known PPI signal vector and the test sequence of PI signal vectors are generated, the initial sequence of PI signal vectors and the initial PPI signal vector cooperating when applied to the digital circuit to cause the error signal at the faulty node in the digital circuit to propagate to the PO of the digital circuit, a method of producing a sequence of reduced PI signal vectors that has fewer assigned PI signals than the first sequence of PI signal vectors and that cooperates with the known PPI signal vector when applied to the digital circuit to propagate the error signal from the faulty node to the PO, the method comprising the steps of:

a) selecting a test PI signal that has an assigned signal value from the test sequence of PI signal vectors;

b) storing the assigned signal value in the memory and setting the selected test PI signal to the complement of the stored assigned signal value to produce a sequence of modified PI signal vectors;

c) applying the sequence of modified PI input signal vectors and the known PPI signal vector to the digital circuit; and d) if the error signal does not propagate from the faulty node to the primary output, retrieving the stored assigned signal value from the memory, and assigning the stored assigned signal value to the selected test PI signal in a sequence of reduced PI signal vectors, otherwise setting the selected test PI signal to an unassigned value in the sequence of reduced PI signal vectors.

9. In a digital circuit testing system including a memory for storing therein digital circuit data that is representative of a digital circuit which includes gates having input nodes and output nodes; the digital circuit testing system including a central processing unit (CPU) coupled to the memory for storing and retrieving the digital circuit data therein, the CPU also emulating an application of signals to nodes in the digital circuit, and emulating logic operations of the gates in the digital circuit and output signals thereof in response to emulated input signals applied thereto, and storing results of the emulation within the memory, wherein the digital circuit testing system generates an activating sequence of primary input (PI) signal vectors and an activating pseudo-primary input (PPI) signal vector, the activating sequence of PI signal vectors and the activating PPI signal vector cooperating when applied to the digital circuit to cause an error signal to appear at a faulty node in the digital circuit and to propagate to at least one pseudo-primary output (PPO) of the digital circuit, a method of generating a test sequence of PI signal vectors for causing the error signal at the faulty node to propagate to a primary output (PO) of the digital circuit, the method comprising the steps of:

a) applying the activating PPI signal vector and the activating sequence of PI signal vectors to the digital circuit;

b) determining the set of those gates in the digital circuit that have an error signal on a gate input node and also have an undetermined (X) value on an output node;

c) selecting a next gate from the set of gates, and storing in the memory indications of the remaining unselected gates in the set;

d) for each dominator gate of the next gate, assigning propagating signal values to a set of dominator input nodes that cooperate in the digital circuit to cause the error signal to propagate to an output node of each dominator gate;

e) for every assigned propagating signal value, assigning to as yet unassigned test PI nodes, test PI signal values that cooperate in the digital circuit to generate the assigned propagating signal values at the dominator input nodes;

f) emulating the propagation of the error signal through each dominator gate and all other gates in the circuit that are conditioned by the assigned test PI signal values to propagate the error signal to a set of successor input nodes of a set of successor gates; and g) repeating steps c) through f), using the successor gates in place of the next gates and using the successor input nodes in place of the gate input nodes, until the error signal has arrived at the PO.

10. A method accordingly to claim 9 further comprising the steps of:

h) determining whether signal assignments can be made to as yet unassigned test PI nodes that generate the assigned propagating signal values at the dominator input nodes, and if not, then unassigning all test PI signal values assigned during step e), and retrieving from the memory the set of remaining unselected gates and selecting a next gate therefrom, and continuing at step d).

11. In a digital circuit testing system including a memory for storing therein digital circuit data that is representative of a digital circuit which includes gates having input nodes and output nodes; the digital circuit testing system including a central processing unit (CPU) coupled to the memory for storing and retrieving the digital circuit data therein, the CPU also emulating an application of signals to nodes in the digital circuit, and emulating logic operations of the gates in the digital circuit and output signals thereof in response to emulated input signals applied thereto, and storing results of the emulation within the memory, wherein the digital circuit testing system generates an activating sequence of primary input (PI) signal vectors and an activating pseudo-primary input (PPI) signal vector, the activating sequence of PI signal vectors and the activating PPI signal vector cooperating when applied to the digital circuit to cause an error signal to appear at a faulty node in the digital circuit, and to propagate to a pseudo primary output (PPO) in the digital circuit, a method of generating a reduced test sequence of PI signal vectors for causing the error signal at the PPO to propagate to at least one primary output (PO) of the digital circuit, the method comprising the steps of:

a) selecting a last PI signal vector from the activating sequence of PI signal vectors and assigning the selected PI signal vector to a reduced test sequence of PI signal vectors;

b) applying the reduced test sequence of PI signal vectors to the digital circuit;

c) if the error signal propagates from the faulty node to the PPO, then continuing at step d), otherwise selecting from the activating sequence of PI signal vectors a predecessor PI signal vector to the previously selected PI signal vector, assigning the selected predecessor PI signal vector to the reduced test sequence of PI signal vectors and repeating steps b) and c); and d) assigning PI signal values to as yet unassigned PI nodes in the reduced test sequence of PI signal vectors, the PI signal values cooperating when applied in conjunction with the activating PPI signal vector and the activating sequence of PI signal vectors to cause the error signal to propagate to the PO.

12. A method according to claim 10, wherein the step of assigning PI signal values to as vet unassigned PI nodes in the reduced test sequence of PI signal vectors, the PI signal values cooperating when applied in conjunction with the activating PPI signal vector and the activating sequence of PI signal vectors to cause the error signal to propagate to the PO comprises the steps of:

e) determining the set of those gates in the digital circuit that have an error signal on a gate input node and also have an undetermined (X) value on an output node;

f) selecting a next gate from the set of gates, and storing in the memory indications of the remaining unselected gates in the set;

g) for each dominator gate of the next gate, assigning propagating signal values to a set of dominator input nodes that cooperate in the digital circuit to cause the error signal to propagate to an output node of each dominator gate;

h) for every assigned propagating, signal value, assigning to as yet unassigned PI nodes in the reduced test sequence of PI signal vectors, PI signal values that cooperate in the digital circuit to generate the assigned propagating signal values at the dominator input nodes;

i) emulating the propagation of the error signal through each dominator gate and all other gates in the circuit that are conditioned by the assigned PI signal values in the reduced test sequence of PI signal vectors to propagate the error signal to a set of successor input nodes of asset of successor gates; and j) repeating steps f) through i), using the successor gates in place of the next gates and using the successor input nodes in place of the gate input nodes, until the error signal has arrived at the PO.

13. A method according to claim 12 further comprising the steps of:

k) determining whether signal assignments can be made to as yet unassigned PI nodes in the reduced test sequence of PI signal vectors that generate the assigned propagating signal values at the dominator input nodes, and if not, then unassigning all PI signal values that were assigned during step h), and retrieving from the memory the set of remaining unselected gates and selecting a next gate therefrom, and continuing at step g).

* * * * *